(12) United States Patent
Jang et al.

(10) Patent No.: US 12,317,645 B2
(45) Date of Patent: May 27, 2025

(54) DISPLAY DEVICE, METHOD OF PROVIDING THE SAME, AND TILED DISPLAY DEVICE INCLUDING DISPLAY DEVICE

(71) Applicant: Samsung Display Co., LTD., Yongin-si (KR)

(72) Inventors: Dae Hwan Jang, Seoul (KR); Seok Hyun Nam, Seoul (KR); Jin Ho Cho, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/592,430

(22) Filed: Feb. 3, 2022

(65) Prior Publication Data
US 2022/0328724 A1 Oct. 13, 2022

(30) Foreign Application Priority Data
Apr. 12, 2021 (KR) ........................ 10-2021-0047028

(51) Int. Cl.
*G02F 1/13* (2006.01)
*G02F 1/1339* (2006.01)
*G02F 1/1362* (2006.01)
*G09F 9/302* (2006.01)
*G09G 3/36* (2006.01)
*H01L 23/495* (2006.01)
*H01L 25/075* (2006.01)
*H01L 25/16* (2023.01)
(Continued)

(52) U.S. Cl.
CPC ......... *H10H 20/831* (2025.01); *G09F 9/3026* (2013.01); *H10H 20/01* (2025.01); *H10H 20/851* (2025.01); *H10H 20/857* (2025.01); *H10H 29/142* (2025.01); *H10H 20/032* (2025.01); *H10H 20/0364* (2025.01)

(58) Field of Classification Search
CPC ..... H01L 33/38; H01L 27/156; H01L 33/005; H01L 33/50–62; H01L 2933/0016; H01L 2933/0066; G09F 9/3026
See application file for complete search history.

(56) References Cited

U.S. PATENT DOCUMENTS 10,248,271 B2    4/2019   Imazeki
11,004,892 B2    5/2021   Kim et al.
(Continued)

FOREIGN PATENT DOCUMENTS

CN    113314509 A  *  8/2021  ............. H01L 25/04
JP    2000311981 A    11/2000
(Continued)

*Primary Examiner* — Lin Li
(74) *Attorney, Agent, or Firm* — CANTOR COLBURN LLP

(57) ABSTRACT

A display device includes a first substrate including a first contact hole, a pad part on an upper surface of the first substrate and defining a second contact hole corresponding to the first contact hole, a bump connection electrode on the first substrate and extended into the second contact hole, a display layer on the pad part and the bump connection electrode, a flexible film on a lower surface of the first substrate and including a lead electrode adjacent to the first contact hole, and a bump electrode electrically connecting the lead electrode and the bump connection electrode to each other.

25 Claims, 21 Drawing Sheets

(51) Int. Cl.
*H01L 33/62* (2010.01)
*H05K 7/14* (2006.01)
*H10H 20/01* (2025.01)
*H10H 20/831* (2025.01)
*H10H 20/851* (2025.01)
*H10H 20/857* (2025.01)
*H10H 29/14* (2025.01)
*H10K 59/121* (2023.01)
*H10K 71/00* (2023.01)

(56) References Cited

U.S. PATENT DOCUMENTS

| | | |
|---|---|---|
| 11,682,693 B2 | 6/2023 | Kim et al. |
| 2007/0262439 A1* | 11/2007 | Huang .............. H01L 23/49572 257/E23.129 |
| 2016/0336540 A1* | 11/2016 | Li ........................... G02F 1/13 |
| 2018/0032175 A1* | 2/2018 | Imazeki ................ G02F 1/1339 |
| 2018/0190631 A1* | 7/2018 | Kim ...................... H01L 25/162 |
| 2019/0386087 A1* | 12/2019 | Woo .................. G02F 1/136227 |
| 2020/0026119 A1* | 1/2020 | Imazeki ................ G09G 3/3648 |
| 2020/0163246 A1* | 5/2020 | Yueh .................... H05K 7/1451 |
| 2020/0328266 A1* | 10/2020 | Liu ........................ H10K 71/00 |
| 2020/0359499 A1* | 11/2020 | Hwu ...................... H10K 59/131 |
| 2021/0183833 A1* | 6/2021 | Hu ........................ H01L 33/62 |
| 2021/0202906 A1* | 7/2021 | Kim ...................... H10K 59/121 |
| 2021/0408052 A1* | 12/2021 | Liang ..................... H01L 33/62 |
| 2022/0068998 A1* | 3/2022 | Luo ........................ H01L 33/62 |
| 2022/0210916 A1* | 6/2022 | Shueh ................ H01L 25/0753 |

FOREIGN PATENT DOCUMENTS

| | | |
|---|---|---|
| JP | 2018017980 A | 2/2018 |
| KR | 20010093018 A | 10/2001 |
| KR | 20190068112 A | 6/2019 |
| KR | 20200016424 A | 2/2020 |

* cited by examiner

DISPLAY DEVICE, METHOD OF PROVIDING THE SAME, AND TILED DISPLAY DEVICE INCLUDING DISPLAY DEVICE

This application claims the benefit of Korean Patent Application No. 10-2021-0047028, filed on Apr. 12, 2021, and all the benefits accruing therefrom under 35 U.S.C. § 119, the disclosure of which is incorporated herein in its entirety by reference.

BACKGROUND

1. Field

The present disclosure relates to a display device, a method of providing or manufacturing the same, and a tiled display device including the display device.

2. Description of the Related Art

As the information society develops, the demand for display devices for displaying images is increasing in various forms. For example, display devices are being applied to various electronic devices such as smartphones, digital cameras, notebook computers, navigation devices, and smart televisions. The display devices may be flat panel display devices such as liquid crystal display devices, field emission display devices, and organic light emitting display devices. Among the flat panel display devices, a light emitting display device includes a light emitting element that enables each pixel of a display panel to self-emit light. Thus, the light emitting display device can display an image without a backlight unit that provides light to the display panel.

When a display device is manufactured to have a large size, a number of light emitting elements in the pixels may increase due to an increase in the number of pixels.

SUMMARY

When a display device is manufactured to have a large size, a defect rate of light emitting elements in the pixels may increase due to an increase in the number of pixels, and productivity or reliability may be reduced. To solve these problems, a tiled display device may be implemented to provide a large screen by connecting a plurality of relatively small display devices. The tiled display device may include a boundary part called a seam between the display devices due to a non-display area or a bezel area of each of the display devices adjacent to each other. When one image is displayed on the entire screen of the tiled display device, the boundary part between the relatively small display devices gives a sense of separation to the entire screen, thereby reducing the degree of immersion in the image.

One or more embodiment provides a display device which can reduce or effectively prevent damage to a display area and improve visibility by electrically connecting a flexible film disposed under a substrate and a pad part disposed above the substrate without using a thermocompression process, a method of providing or manufacturing the display device, and a tiled display device including the display device.

One or more embodiment also provides a tiled display device which can eliminate a sense of separation between a plurality of display devices and improve the degree of immersion in images by reducing or effectively preventing recognition of a boundary part or a non-display area from outside the tiled display device.

However, embodiments of the present disclosure are not restricted to the one set forth herein. The above and other features of the present disclosure will become more apparent to one of ordinary skill in the art to which the present disclosure pertains by referencing the detailed description of the present disclosure given below.

According to an embodiment of the disclosure, a display device includes a first substrate including a first contact hole, a pad part on the first substrate and including a second contact hole overlapping the first contact hole in a thickness direction, a bump connection electrode on the first substrate and inserted into the second contact hole, a display layer on the pad part and the bump connection electrode, a flexible film on a lower surface of the first substrate and including a lead electrode adjacent to the first contact hole, and a bump electrode electrically connecting the lead electrode and the bump connection electrode.

A side of the bump electrode may cover at least a part of the lead electrode, and the other side of the bump electrode may be inserted into the first contact hole to contact the bump connection electrode.

A distance between a lower end of the bump electrode and the lower surface of the first substrate may be greater than a distance between a lower surface of the lead electrode and the lower surface of the first substrate.

The bump electrode may be a solder ball including at least one of tin (Sn), silver (Ag), copper (Cu), gold (Au), and nickel (Ni).

The pad part may include a lower electrode disposed on the first substrate and an upper electrode disposed on the lower electrode. The bump connection electrode may include a material having stronger adhesion to the bump electrode than to the lower electrode.

The lower electrode may include a material having stronger adhesion to the first substrate than to the upper electrode.

The display layer may include a thin-film transistor layer including a connection line and a thin-film transistor, a light emitting element layer on the thin-film transistor layer and including a light emitting element, and a wavelength conversion layer on the light emitting element layer to convert a wavelength of light emitted from the light emitting element.

The display device may further include a second substrate covering the pad part and the bump connection electrode and supporting the display layer. The connection line may be inserted into a third contact hole provided in the second substrate to contact the pad part.

The connection line may supply an electric signal received from the pad part to the thin-film transistor.

The bump electrode and the flexible film may overlap the light emitting element in the thickness direction.

According to an embodiment of the disclosure, a method of providing a display device includes preparing a first substrate, providing a pad part on the first substrate, providing a bump connection electrode on the first substrate and surrounded by the pad part, providing a first contact hole by patterning the first substrate, attaching a flexible film, which includes a lead electrode adjacent to the first contact hole, to a lower surface of the first substrate, and providing a bump electrode electrically connecting the lead electrode and the bump connection electrode.

The providing of the bump electrode may include performing a jet soldering process, a solder paste process, or a solder film process.

The jet soldering process may include covering the lead electrode and the first contact hole by injecting a solder solution heated to a liquid state and providing a solder ball by cooling and solidifying the solder solution.

The providing of the bump electrode may including using a solder ball including at least one of tin (Sn), silver (Ag), copper (Cu), gold (Au), and nickel (Ni).

The providing of the bump connection electrode may include inserting the bump connection electrode into a second contact hole provided in the pad part.

The providing of the pad part may include providing a lower electrode on the first substrate, and providing an upper electrode on the lower electrode.

The providing of the bump connection electrode may include providing a bump connection electrode made of a material having stronger adhesion to the bump electrode than to the lower electrode.

The method may further include providing a second substrate which is disposed on the bump connection electrode and includes a third contact hole exposing the pad part, and providing a connection line which is disposed on the second substrate and inserted into the third contact hole.

According to an embodiment of the disclosure, a display device includes a first substrate including a plurality of first contact holes, a plurality of pad parts on the first substrate and including second contact holes overlapping each of the first contact holes in a thickness direction, a plurality of bump connection electrodes on the first substrate and inserted into the second contact holes of each of the pad parts, a display layer on the pad parts and the bump connection electrodes, a flexible film on a lower surface of the first substrate and including a plurality of lead electrodes, and a plurality of bump electrodes inserted into each of the first contact holes, to electrically connect each of the lead electrodes to corresponding bump connection electrode of the plurality of the bump connection electrode.

At least a part of each of the lead electrodes may be inserted into a corresponding first contact hole among the first contact holes.

One lead electrode among the lead electrodes, a bump electrode connected to the lead electrode, and a bump connection electrode connected to the bump electrode may overlap in the thickness direction.

The pad parts or the lead electrodes may be insulated by the first substrate.

The bump electrode may be a solder ball including at least one of tin (Sn), silver (Ag), copper (Cu), gold (Au), and nickel (Ni).

According to an embodiment of the disclosure, a tiled display device includes a plurality of display devices, each including a display area having a plurality of pixels and a non-display area surrounding the display area, and a coupling member coupling the display devices together. Each of the display devices includes a first substrate including a first contact hole, a pad part on the first substrate and including a second contact hole overlapping the first contact hole in a thickness direction, a bump connection electrode on the first substrate and inserted into the second contact hole, a display layer on the pad part and the bump connection electrode, a flexible film on a lower surface of the first substrate and including a lead electrode adjacent to the first contact hole, and a bump electrode electrically connecting the lead electrode and the bump connection electrode.

A side of the bump electrode may cover at least a part of the lead electrode, and the other side of the bump electrode may be inserted into the first contact hole to contact the bump connection electrode.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
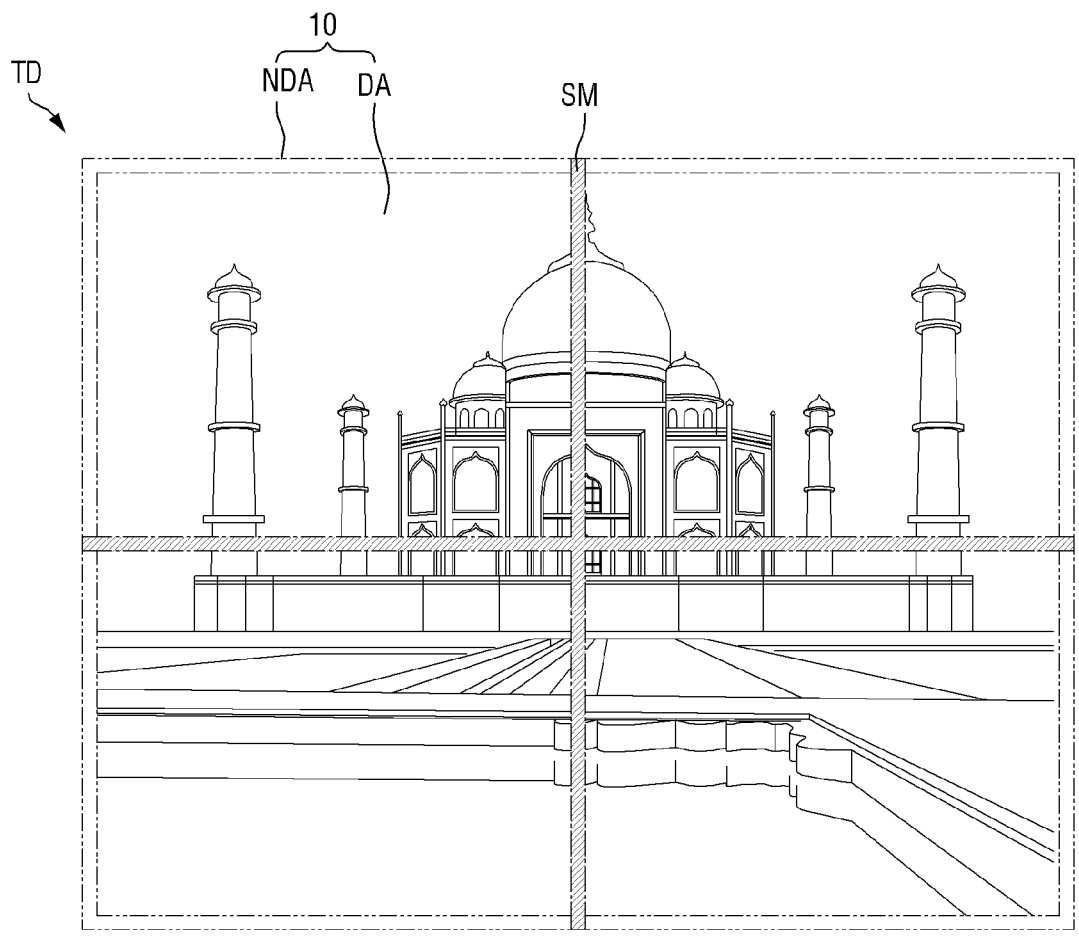
FIG. 1 is a plan view of an embodiment of a tiled display device.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements. As used herein, a reference number may indicate a singular element or a plurality of the element. For example, a reference number labeling a singular form of an element within the drawing figures may be used to describe a plurality of the singular element within the text of specification.

When an element, such as a layer, is referred to as being related to another element such as being "on," "connected to," or "coupled to" another element or layer, it may be directly on, connected to, or coupled to the other element or layer or intervening elements or layers may be present. When, however, an element or layer is referred to as being related to another element such as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another (e.g., intersecting, crossing, inclined, etc.).

For the purposes of this disclosure, "at least one of X, Y, and Z" and "at least one selected from X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be provided or formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

FIG. 1 is a plan view of an embodiment of a tiled display device TD.

Referring to FIG. 1, the tiled display device TD may include a display device 10 provided in plural including a plurality of display devices 10. The display devices 10 may be arranged in a lattice shape, but the present disclosure is not limited thereto. The display devices 10 may be connected to each other in or along a first direction (X-axis direction) or a second direction (Y-axis direction), and the tiled display device TD may have an overall shape defined by the display devices 10 which are connected to each other. In an embodiment, for example, the display devices 10 may have the same size, but the present disclosure is not limited thereto. In an embodiment, for another example, the display devices 10 may have different sizes. A size of a display device 10 may be defined by a dimension along the first direction and a dimension along the second direction Each of the display devices 10 may be shaped like a rectangle including long sides and short sides. The long sides or short sides of the display devices 10 may be connected to each other. A portion of the display devices 10 may be disposed at an edge of the tiled display device TD to form a side or outer edge of the tiled display device TD. A portion of the display devices 10 may be disposed at corners of the tiled display device TD and may form two adjacent sides or outer edges of the tiled display device TD which meet at a corner of the tiled display device TD. The display devices 10 providing an outer edge or a corner of the tiled display device TD may be outer display devices 10. A portion of the display devices 10 may be disposed at an inside of the tiled display device TD and surrounded by the display devices 10 which provide the outer edge and the corners of the tiled display device TD (e.g., inner display devices 10).

Each of the display devices 10 may include a display area DA and a non-display area NDA which is adjacent to the display area DA. The display area DA may include a plurality of pixels to display an image. Each of the pixels may include an organic light emitting diode including an organic light emitting layer, a micro light emitting diode, a quantum dot light emitting diode including a quantum dot light emitting layer, or an inorganic light emitting element including an inorganic semiconductor. A case where each of the pixels includes an inorganic light emitting element will be mainly described below, but the present disclosure is not limited thereto. In an embodiment, the non-display area NDA may be disposed around the display area DA to surround the display area DA and may not display an image.

The overall shape of the tiled display device TD may be a planar shape, but the present disclosure is not limited thereto. The tiled display device TD may also have a three-dimensional (3D) shape to provide a 3D effect to a user. In an embodiment, for example, when the tiled display device TD has a 3D shape, at least some of the display devices 10 may have a curved shape. In an embodiment, for another example, the display devices 10 may each have a planar shape but may be connected to each other at an angle so that the tiled display device TD can have a 3D shape.

The tiled display device TD may include a coupling area SM disposed between a plurality of display areas DA. The tiled display device TD may be formed or provided by connecting the respective non-display areas NDA of adjacent display devices 10 to each other. The display devices 10 may be connected to each other through a coupling member 20 or an adhesive member disposed in the coupling area SM. The coupling area SM of each of the display devices 10 may not include a pad part PD of the display device 10 or a flexible film FPCB of the display device 10 which is attached to the pad part PD. Therefore, a distance between the respective display areas DA of the display devices 10 adjacent to each other may be small enough to make the coupling area SM between the display devices 10 unrecognizable from outside the tiled display device TD (e.g., such as by a user). In addition, external light reflectance of the display area DA of each of the display devices 10 and external light reflectance of the coupling area SM between the display devices 10 may be substantially equal. Therefore, the tiled display device TD may eliminate a sense of separation between the display devices 10 and improve the degree of immersion in images by reducing or effectively preventing the coupling area SM between the display devices 10 from being recognized by a user.

Figure 2:
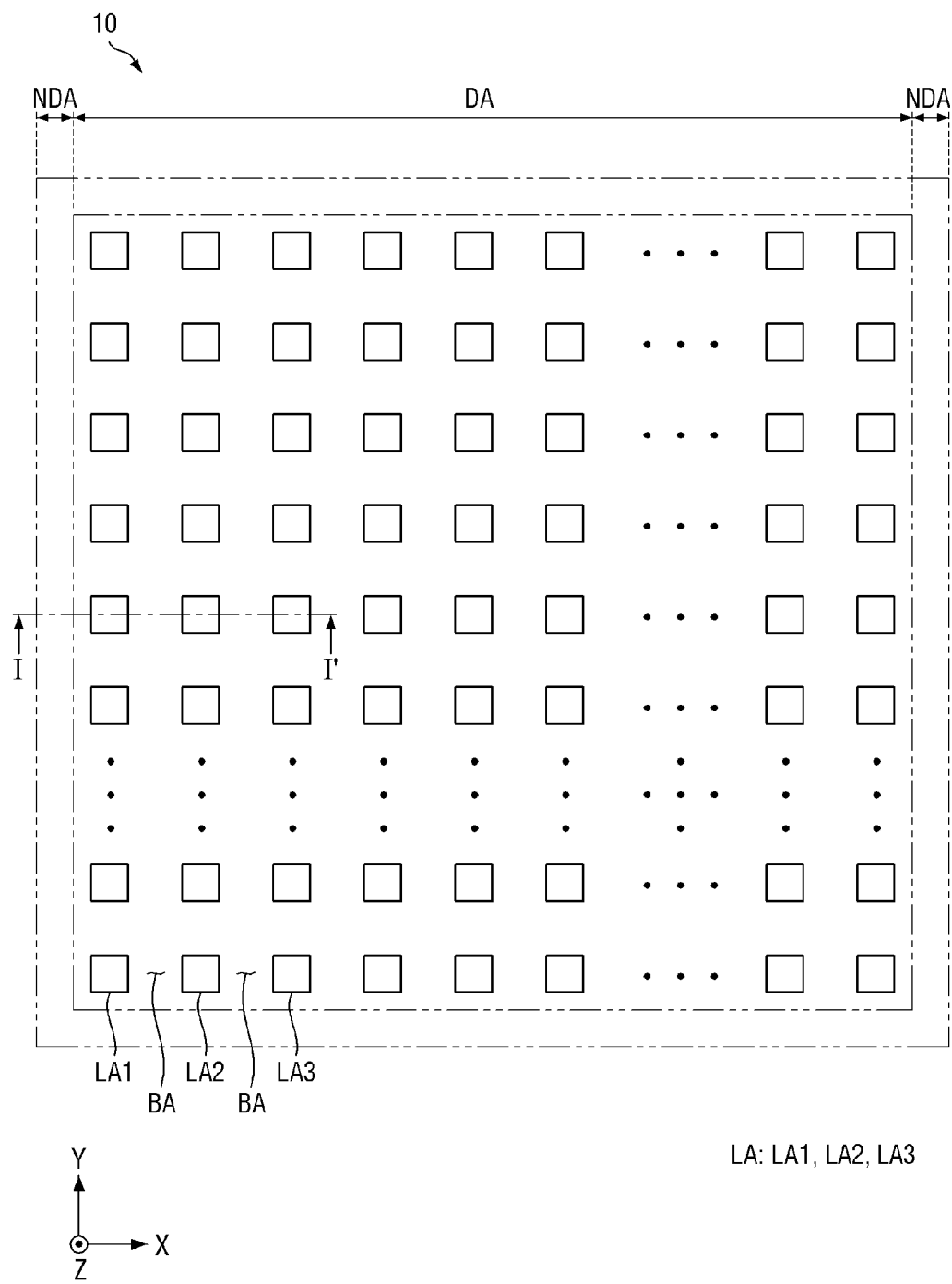
FIG. 2 is a plan view of an embodiment of a display device.

FIG. 2 is a plan view of an embodiment of a display device 10.

Referring to FIG. 2, the display device 10 may include a plurality of pixels arranged along a plurality of rows and a plurality of columns in the display area DA. Each of the pixels may include a light emitting area LA defined by a pixel defining layer or a bank and may emit light having a peak wavelength through the light emitting area LA. In an embodiment, for example, the display area DA of the display device 10 may include first through third light emitting areas LA1 through LA3. Each of the first through third light emitting areas LA1 through LA3 may be a planar area where light generated by a light emitting element ED of the display device 10 is emitted to the outside of the display device 10.

Each of the first through third light emitting areas LA1 through LA3 may emit light having a peak wavelength to the outside of the display device 10. The first light emitting area LA1 may emit light of a first color, the second light emitting area LA2 may emit light of a second color, and the third light emitting area LA3 may emit light of a third color. In an embodiment, for example, the light of the first color may be red light having a peak wavelength of about 610 nanometers (nm) to about 650 nm, the light of the second color may be green light having a peak wavelength of about 510 nm to about 550 nm, and the light of the third color may be blue light having a peak wavelength of about 440 nm to about 480 nm. However, the present disclosure is not limited thereto.

The first through third light emitting areas LA1 through LA3 may be sequentially and repeatedly arranged along the first direction (X-axis direction) of the display area DA. In an embodiment, for example, the planar area of the first light emitting area LA1 may be larger than the planar area of the second light emitting area LA2, and the planar area of the second light emitting area LA2 may be larger than the planar area of the third light emitting area LA3. In an embodiment, for another example, the planar area of the first light emitting area LA1, the planar area of the second light emitting area LA2, and the planar area of the third light emitting area LA3 may be substantially equal.

The display area DA of each display device 10 may include a light blocking area BA surrounding the light emitting areas LA. The light blocking area BA may reduce or effectively prevent color mixing of light emitted from the first through third light emitting areas LA1 through LA3.

Figure 3:
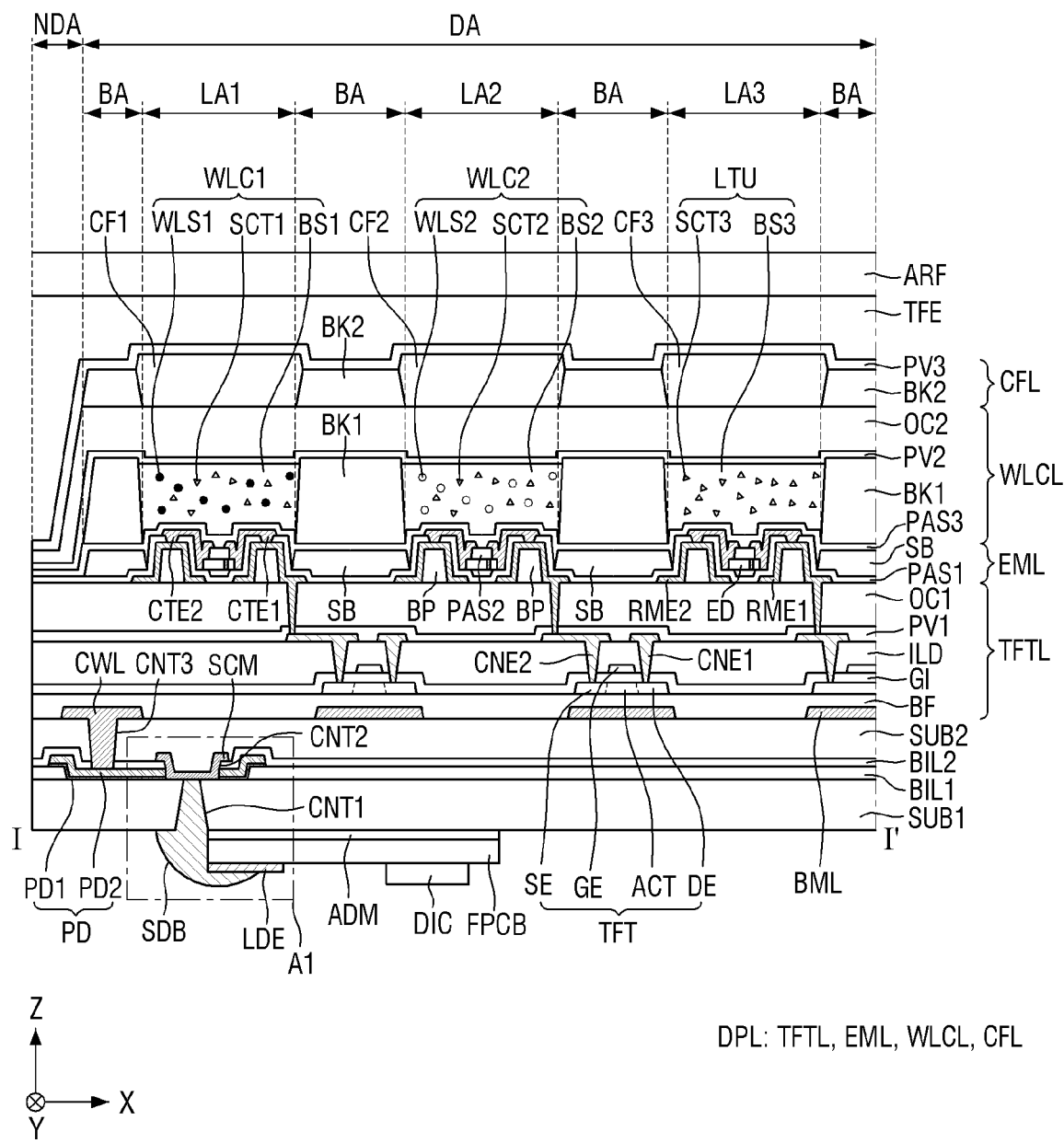
FIG. 3 is a cross-sectional view taken along line I-I' of FIG. 2.
Figure 4:
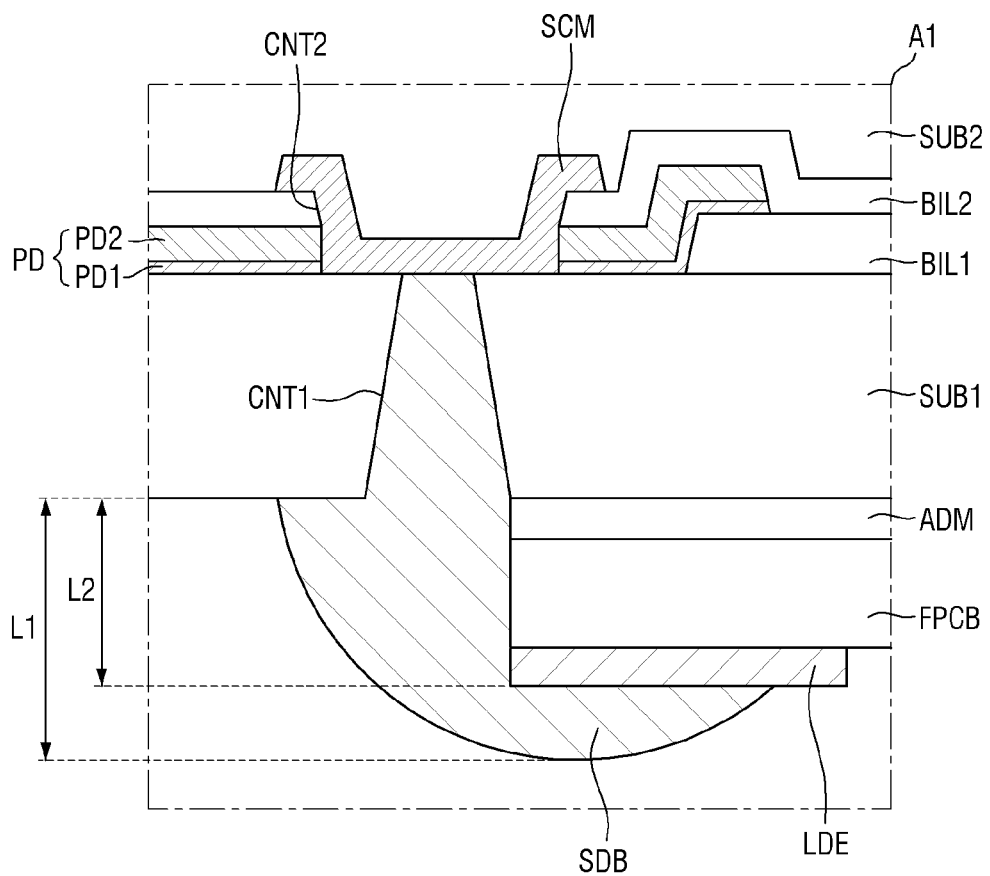
FIG. 4 is an enlarged view of area A1 of FIG. 3.
Figure 5:
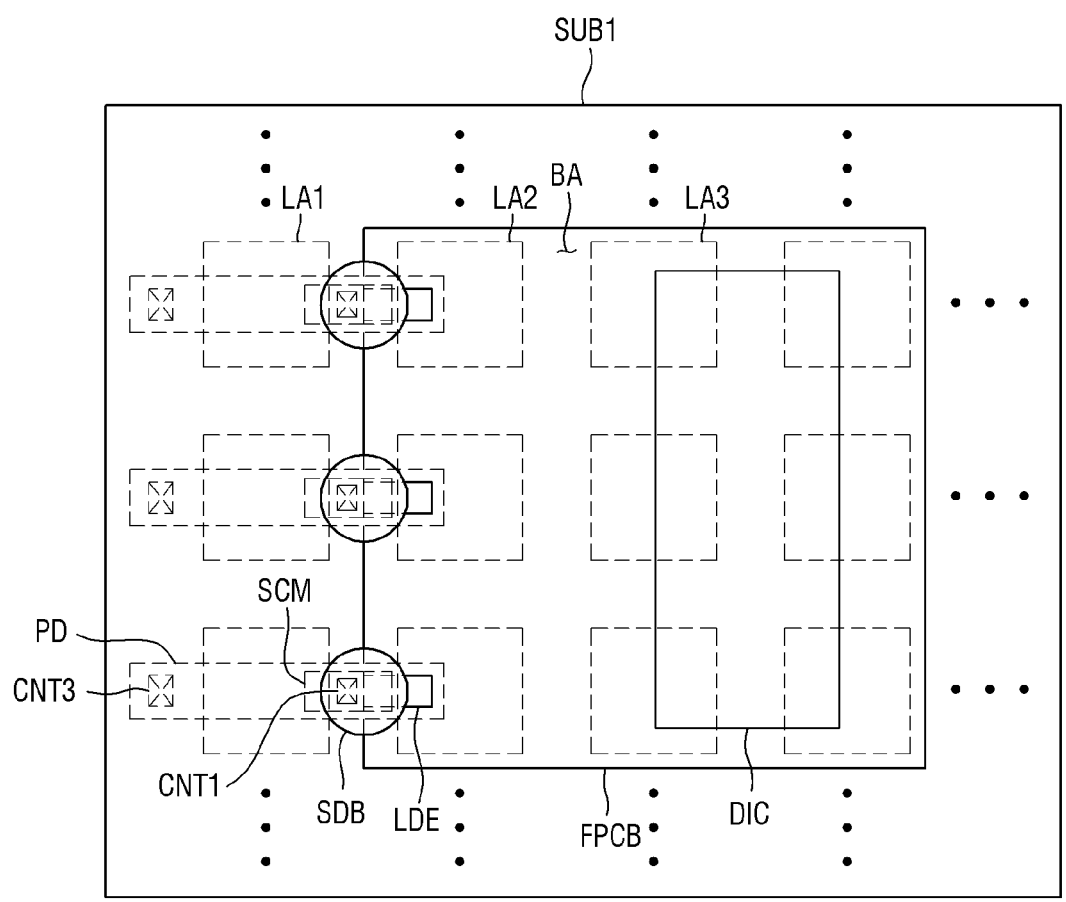
FIG. 5 is an embodiment of a bottom view of the display device.

FIG. 3 is a cross-sectional view taken along line I-I' of FIG. 2. FIG. 4 is an enlarged view of area A1 of FIG. 3. FIG. 5 is an embodiment of a bottom view of the display device 10.

Referring to FIGS. 3 through 5, the display area DA of the display device 10 may include the first through third light emitting areas LA1 through LA3. Each of the first through third light emitting areas LA1 through LA3 may be a planar area or an area where light generated by a light emitting element ED of the display device 10 is emitted to the outside of the display device 10.

The display device 10 may include a first substrate SUB1, a first barrier insulating layer BIL1 a pad part PD, a second barrier insulating layer BIL2, a bump connection electrode SCM, a second substrate SUB2, a display layer DPL, an encapsulation layer TFE, an antireflection layer ARF, a flexible film FPCB, a data driver DIC, and a bump electrode SDB.

The first substrate SUB1 may support the display device 10. The first substrate SUB1 may be a base substrate or a base member. The first substrate SUB1 may be a flexible substrate that is bendable, foldable, rollable (e.g., can be bent, folded, rolled, etc.). In an embodiment, for example, the first substrate SUB1 may include, but is not limited to, an insulating material such as polymer resin (e.g., polyimide (PI)). In an embodiment, for another example, the first substrate SUB1 may be a rigid substrate including a glass material.

The first substrate SUB1 may include or provide a first contact hole CNT1. A sidewall of the first substrate SUB1 may define the first contact hole CNT1. The first contact hole CNT1 may be provided by etching the first substrate SUB1 in a direction from a lower surface of the first substrate SUB1 to an upper surface of the first substrate SUB1 which is opposite to the lower surface. A contact hole may have a dimension (e.g., a width) in a direction along a plane of the first substrate SUB1, where the plane is defined by the first direction and the second direction crossing each other. In an embodiment, for example, a lower width of the first contact hole CNT1 corresponding to the lower surface of the first substrate SUB1 may be greater than an upper width of the first contact hole CNT1 corresponding to the upper surface of the first substrate SUB1. In a process of manufacturing or providing the display device 10, a lower surface of the bump connection electrode SCM may be exposed to outside the first substrate SUB1 by the first contact hole CNT1, and the bump connection electrode SCM may contact the bump electrode SDB in the first contact hole CNT1. As used herein, elements which contact each other may form a boundary or interface therebetween.

The first barrier insulating layer BIL1 may be disposed on the first substrate SUB1. The first barrier insulating layer BIL1 may include an inorganic layer that can prevent penetration of air or moisture. In an embodiment, for example, the first barrier insulating layer BIL1 may include, but is not limited to, at least one of a silicon nitride layer, a silicon oxynitride layer, a silicon oxide layer, a titanium oxide layer, an aluminum oxide layer, and an amorphous silicon layer.

The pad part PD may be disposed on the first substrate SUB1. Edges of the pad part PD may cover edges of the first barrier insulating layer BIL1. Therefore, the pad part PD may be formed after the first barrier insulating layer BIL1 is patterned on the first substrate SUB1. The pad part PD may be disposed in the display area DA or may be disposed in both the display area DA and the non-display area NDA. Since the display device 10 includes the pad part PD having at least a portion thereof in the display area DA, the planar area of the non-display area NDA can be minimized. In an embodiment, for example, the pad part PD may be a single layer or a multilayer made of any one or more of molybdenum (Mo), aluminum (Al), chromium (Cr), gold (Au), silver (Ag). titanium (Ti), nickel (Ni), neodymium (Nd), copper (Cu), and alloys of the same.

The pad part PD may electrically connect the bump connection electrode SCM and a connection line CWL. The pad part PD may he electrically connected to the bump electrode SDB and the flexible film FPCB through the bump connection electrode SCM. The pad part PD may he electrically connected to a thin-film transistor TFT of pixel through the connection line CWL. Therefore, the pad part PD may supply an electric signal received from the flexible film FPCB to the thin-film transistor TFT of the pixel through the connection line CWL. That is, the connection line CWL of the thin-film transistor layer TFTL supplies the electric signal from the pad part PD to the thin-film transistor TFT of the thin-film transistor layer TFTL.

The pad part PD may include a lower electrode PD1 and an upper electrode PD2 which faces the lower electrode PD1. The pad part PD may include the lower electrode PD1 and the upper electrode PD2 in order from the upper surface of the first substrate SUB1. A lower surface of the lower electrode PD1 may contact the upper surface of the first substrate SUB1. The lower electrode PD1 may include a material having stronger adhesion to the first substrate SUB1 than to the upper electrode PD2. In an embodiment, for example, the lower electrode PD1 may include titanium (Ti) and thus may be easily attached onto the first substrate SUB1 including polyimide (PI), but the material of the lower electrode PD1 is not limited thereto.

The upper electrode PD2 may be disposed on the lower electrode PD1. The upper electrode PD2 may be further from the first substrate SUB1 than the lower electrode PD1. A thickness direction (Z-axis direction) may be defined as a third direction which crosses the first direction and the second direction. A thickness of the upper electrode PD2 may be greater than a thickness of the lower electrode PD1. The thickness of the upper electrode PD2 may be, but is not limited to, ten times or more of the thickness of the lower electrode PD1. In an embodiment, for example, the upper electrode PD2 may include copper (Cu) and thus may be easily attached to the connection line CWL inserted or extended into a third contact hole CNT3, but the material of the upper electrode PD2 is not limited thereto. The third contact hole CNT3 which is defined in the second substrate SUB2 exposes the pad part PD to outside the second substrate SUB2.

The second barrier insulating layer BIL2 may be disposed on the first barrier insulating layer BIL1 and the pad part PD. The second barrier insulating layer BIL2 may include an inorganic layer that can reduce or effectively prevent penetration of air or moisture. In an embodiment, for example, the second barrier insulating layer BIL2 may include, but is not limited to, at least one of a silicon nitride layer, a silicon oxynitride layer, a silicon oxide layer, a titanium oxide layer, an aluminum oxide layer, and an amorphous silicon layer.

The pad part PD and the second barrier insulating layer BIL2 may include or define a second contact hole CNT2. The second contact hole CNT2 may overlap or correspond to the first contact hole CNT1 in a thickness direction (Z-axis direction). The second contact hole CNT2 may be provided by etching in a direction from an upper surface of the second barrier insulating layer BIL2 to the lower surface of the lower electrode PD1 of the pad part PD. In an embodiment, for example, an upper width of the second contact hole CNT2 may be greater than a lower width of the second contact hole CNT2. In the manufacturing process of the display device 10, the upper surface of the first substrate SUB1 may be exposed to outside the pad part PD and the second barrier insulating layer BIL2 by the second contact hole CNT2, and the bump connection electrode SCM may fill the second contact hole CNT2.

The bump connection electrode SCM may be inserted or extend into the second contact hole CNT2. Edges of the bump connection electrode SCM may cover edges of the second barrier insulating layer BIL2. Therefore, the bump connection electrode SCM may be formed in the second contact hole CNT2 after the second barrier insulating layer BIL2 is patterned. The bump connection electrode SCM may be surrounded by the pad part PD in a plan view. The bump connection electrode SCM may be formed through, but not limited to, an inkjet process or a dispensing process. A part of the bump connection electrode SCM may be disposed on the first substrate SUB1, and another part of the bump connection electrode SCM may contact the bump electrode SDB inserted into the first contact hole CNT1.

The bump connection electrode SCM may be a single layer or a multilayer made of any one or more of molybdenum (Mo), aluminum (Al), chromium (Cr), gold (Au), silver (Ag), titanium (Ti), nickel (Ni), neodymium (Nd), copper (Cu), and alloys of the same. The bump connection electrode SCM may include a material having stronger adhesion to the bump electrode SDB than to the lower electrode PD1 of the pad part PD. In an embodiment, for example, the bump connection electrode SCM may include copper (Cu) or gold (Au) and thus may be easily attached to the bump electrode SDB which is inserted into the first contact hole CNT1, but the material of the bump connection electrode SCM is not limited thereto. The bump connection electrode SCM including copper (Cu) or gold (Au) may be easily attached to the pad part PD. The bump connection electrode SCM may be made of the same material as the upper electrode PD2 of the pad part PD, but the present disclosure is not limited thereto.

The second substrate SUB2 may be disposed on the second barrier insulating layer BIL2 and the hump connection electrode SCM. The second substrate SUB2 may be a base substrate or a base member. The second substrate SUB2 may be a flexible substrate that can be bent, folded, rolled, etc. In an embodiment, for example, the second substrate SUB2 may include, but is not limited to, an insulating material such as polymer resin (e.g., polyimide (PI)).

The second substrate SUB2 and the second barrier insulating layer BIL2 may include or define the third contact hole CNT3. The third contact hole CNT3 may be etched from an upper surface of the second substrate SUB2 to a lower surface of the second barrier insulating layer BIL2. In an embodiment, for example, an upper width of the third contact hole CNT3 may be greater than a lower width of the third contact hole CNT3. In the manufacturing process of the display device 10, an upper surface of the upper electrode PD2 of the pad part PD may be exposed to outside the second substrate SUB2 and the second barrier insulating layer BIL2 by the third contact hole CNT3, and the upper electrode PD2 may contact the connection line CWL inserted into the third contact hole CNT3.

The display layer DPL may be disposed on the second substrate SUB2. The display layer DPL may include a thin-film transistor layer TFTL, a light emitting element layer EML, a wavelength conversion layer WLCL, and a color filter layer CFL. The thin-film transistor layer TFTL may include a light blocking layer BML, the connection line CWL, a buffer layer BF, the thin-film transistor TFT provided in plural including a plurality of thin-film transistors TFT, a gate insulating layer GI, an interlayer insulating film ILD, first and second connection electrodes CNE1 and CNE2, a first passivation layer PV1, and a first planarization layer OC1.

The light blocking layer BML may be disposed on the second substrate SUB2. The light blocking layer BML may be overlapped by the thin-film transistors TFT in the thickness direction (Z-axis direction) to block external light from entering the thin-film transistors TFT. In an embodiment, for example, the light blocking layer BML may be a single layer or a multilayer made of any one or more of molybdenum (Mo), aluminum (Al), chromium (Cr), gold (Au), silver (Ag), titanium (Ti), nickel (Ni), neodymium (Nd), copper (Cu), and alloys of the same.

The connection line CWL may be disposed on the second substrate SUB2 and spaced apart from the light blocking layer BML. The connection line CWL may be formed in the same layer and of the same material as the light blocking layer BML, but the material of the connection line CWL is not limited thereto. As used herein, elements in a same layer as each other may be respective portions of a same material layer, without being limited thereto. The connection line CWL may be inserted. into the third contact hole CNT3 to contact the pad part PD. In an embodiment, for example, the connection line CWL may be connected to a data line to supply a data voltage to the thin-film transistors TFT. In an embodiment, for another example, the connection line CWL may be connected to a power line to supply a power supply voltage to the thin-film transistors TFT. In an embodiment, for another example, the connection line CWL may be connected to a gate line to supply a gate signal to the thin-film transistors TFT. Therefore, the connection line CWL may supply an electric signal received from the pad part PD to the thin-film transistors TFT of the pixels and may define a signal line.

The buffer layer BF may be disposed on the light blocking layer BML, the connection line CWL, and the second substrate SUB2. The buffer layer BF may include an inorganic material that can reduce or effectively prevent penetration of air or moisture. In an embodiment, for example, the buffer layer BF may include a plurality of inorganic layers stacked alternately.

The thin-film transistors TFT may be disposed on the buffer layer BF and may form respective pixel circuits of a plurality of pixels. In an embodiment, for example, the thin-film transistors TFT may be driving transistors or switching transistors of the pixel circuits. Each of the thin-film transistors TFT may include a semiconductor region ACT, a gate electrode GE, a drain electrode DE, and a source electrode SE.

The semiconductor region ACT, the drain electrode DE, and the source electrode SE may be disposed on the buffer layer BF. The semiconductor region ACT may be overlapped by the gate electrode GE in the thickness direction (Z-axis direction) and insulated from the gate electrode GE by the gate insulating layer GI. The drain electrode DE and the source electrode SE may be formed by making the material of the semiconductor region ACT conductive.

The gate electrode GE may be disposed on the gate insulating layer GI. The gate electrode GE may overlap the semiconductor region ACT with the gate insulating layer GI interposed between them.

The gate insulating layer GI may be disposed on the semiconductor regions ACT, the drain electrodes DE, and the source electrodes SE. In an embodiment, for example, the gate insulating layer GI may cover the semiconductor regions ACT, the drain electrodes DE, the source electrodes SE and the buffer layer BF and insulate the semiconductor regions ACT from the gate electrodes GE. The gate insulating layer GI may include or define contact holes through which the first and second connection electrodes CNE1 and CNE2 pass, respectively.

The interlayer insulating film ILD may be disposed on the gate electrodes GE. The interlayer insulating film ILD may insulate the first and second connection electrodes CNE1 and CNE2 from the thin-film transistors TFT. The interlayer insulating film ILD may include or define contact holes through which the first and second connection electrodes CNE1 and CNE2 pass, respectively.

The first and second connection electrodes CNE1 and CNE2 may be disposed on the interlayer insulating film ILD and spaced apart from each other. The first connection electrodes CNE1 may connect data lines or power lines to the drain electrodes DE of the thin-film transistors TFT. The first connection electrodes CNE1 may contact the drain electrodes DE through the contact holes provided in the interlayer insulating film ILD and the gate insulating layer GI.

The second connection electrodes CNE2 may connect the source electrodes SE of the thin-film transistors TFT and first electrodes RME1. The second connection electrodes CNE2 may contact the source electrodes SE at or through the contact holes provided in the interlayer insulating film ILD and the gate insulating layer GI.

The first passivation layer PV1 may be disposed on the first and second connection electrodes CNE1 and CNE2 and the interlayer insulating film ILD. The first passivation layer PV1 may protect the thin-film transistors TFT. The first passivation layer PV1 may include or define contact holes through which the first electrodes RME1 pass.

The first planarization layer OC1 may be disposed on the first passivation layer PV1 to planarize the top of the thin-film transistor layer TFTL. In an embodiment, for example, the first planarization layer OC1 may include or define contact holes through which the first electrodes RME1 pass. Here, the contact holes of the first planarization layer OC1 may be connected to or aligned with the contact holes of the first passivation layer PV1. The first planarization layer OC1 may include an organic insulating material such as polyimide (PI).

The light emitting element layer EML may be disposed on the thin-film transistor layer TFTL. The light emitting element layer EML may include protruding patterns BP, the first electrodes RME1, second electrodes RME2, a first insulating layer PAS1, a sub-bank SB, light emitting elements ED, a second insulating layer PAS2, first contact electrodes CTE1, second contact electrodes CTE2, and a third insulating layer PAS3.

The protruding patterns BP may be disposed on the first planarization layer OC1. The protruding patterns BP may protrude from an upper surface of the first planarization layer OC1. The protruding patterns BP may be disposed in the light emitting area LA or opening area of each of the pixels. A plurality of light emitting elements ED may be disposed between the protruding patterns BP. The protruding patterns BP may have inclined side surfaces, and light emitted from the light emitting elements ED may be reflected by the first and second electrodes RME1 and RME2 disposed on the protruding patterns BP. In an embodiment, for example, the protruding patterns BP may include an organic insulating material such as polyimide (PI).

The first electrodes RME1 may be disposed on the first planarization layer OC1 and the protruding patterns BP. Each of the first electrodes RME1 may be disposed on a protruding pattern BP disposed on a side of a plurality of light emitting elements ED. Each of the first electrodes RME1 may be disposed on the inclined side surfaces of the protruding pattern BP to reflect light emitted from the light emitting elements ED. Each of the first electrodes RME1 may be inserted into a contact hole provided in the first planarization layer OC1 and the first passivation layer PV1 and may be connected to a second connection electrode CNE2. Each of the first electrodes RME1 may be electrically connected to ends of the light emitting elements ED through a first contact electrode CTE1. In an embodiment, for example, each of the first electrodes RME1 may receive a voltage proportional to the luminance of the light emitting elements ED from a thin-film transistor TFT of a pixel.

The second electrodes RME2 may be disposed on the first planarization layer OC1 and the protruding patterns BP. Each of the second electrodes RME2 may be disposed on a protruding pattern BP disposed on the other side of the light emitting elements ED. Each of the second electrodes RME2 may be disposed on the inclined side surfaces of the protruding pattern BP to reflect light emitted from the light emitting elements ED. Each of the second electrodes RME2 may be electrically connected to the other ends of the light emitting elements ED through a second contact electrode CTE2. In an embodiment, for example, each of the second electrodes RME2 may receive a low-potential voltage supplied from a low-potential line to all pixels.

The first and second electrodes RME1 and RME2 may include a conductive material having high reflectivity. In an embodiment, for example, the first and second electrodes RME1 and RME2 may include at least one among silver (Ag), copper (Cu), aluminum (Al), nickel (Ni), and lanthanum (La). In an embodiment, for another example, the first and second electrodes RME1 and RME2 may include a material such as indium tin oxide (ITO), indium zinc oxide (IZO) or indium tin zinc oxide (ITZO). In an embodiment, for another example, the first and second electrodes RME1 and RME2 may include a plurality of layers having a transparent conductive material layer and a metal layer having high reflectivity or may include a single layer including a transparent conductive material and a metal having high reflectivity. The first and second electrodes RME1 and RME2 may have a stacked structure of ITO/Ag/ITO, ITO/Ag/IZO, or ITO/Ag/ITZO/IZO.

The first insulating layer PAS1 may be disposed on the first planarization layer OC1 and the first and second electrodes RME1 and RME2. The first insulating layer PAS1 may protect the first and second electrodes RME1 and RME2 while insulating them from each other. The first insulating layer PAS1 may reduce or effectively prevent the light emitting elements ED from directly contacting the first and second electrodes RME1 and RME2 and thus being damaged during an alignment process of the light emitting elements ED.

The sub-bank SB may be disposed on the first insulating layer PAS1 in the light blocking area BA. The sub-bank SB may be disposed at boundaries of the pixels to separate the light emitting elements ED of each of the pixels from those of other pixels. The sub-bank SB may have a height and may include an organic insulating material such as polyimide (PI).

The light emitting elements ED may be disposed on the first insulating layer PAS1. In a direction from the first substrate SUB1 to the display layer DPL, the bump electrode SDB and the flexible film FPCB overlap the light emitting element ED. The light emitting elements ED may be aligned parallel to each other between the first and second electrodes RME1 and RME2. A length of each light emitting element ED may be greater than a length of a space between the first and second electrodes RME1 and RME2. Each of the light emitting elements ED may include a plurality of semiconductor layers, and a first end and a second end which is opposite the first end may be defined based on any one semiconductor layer. The first ends of the light emitting elements ED may be disposed on the first electrodes RME1, and the second ends of the light emitting elements ED may be disposed on the second electrodes RME2. The first ends of the light emitting elements ED may be electrically connected to the first electrodes RME1 through the first contact electrodes CTE1, and the second ends of the light emitting elements ED may be electrically connected to the second electrodes RME2 through the second contact electrodes CTE2.

Each of the light emitting elements ED may be an inorganic light emitting diode having a size of micrometers or nanometers and including an inorganic material. The inorganic light emitting diode may be aligned between the first and second electrodes RME1 and RME2 facing each other according to an electric field formed in a direction between the first and second electrodes RME1 and RME2.

In an embodiment, for example, the light emitting elements ED may include active layers having the same material to emit light of the same wavelength band or light of the same color. Light emitted from the first through third light emitting areas LA1 through LA3 may have the same color. In an embodiment, for example, the light emitting elements ED may emit light of the third color or blue light having a peak wavelength of about 440 nm to about 480 nm, but the present disclosure is not limited thereto.

The second insulating layer PAS2 may be disposed on the light emitting elements ED. In an embodiment, for example, the second insulating layer PAS2 may partially cover the light emitting elements ED and may not cover both ends of each of the light emitting elements ED. The second insulating layer PAS2 may protect the light emitting elements ED and fix the light emitting elements ED in the manufacturing process of the display device 10. The second insulating layer PAS2 may fill a space between each light emitting element ED and the first insulating layer PAS1.

The first contact electrodes CTE1 may be disposed on the first insulating layer PAS1 and may be inserted into contact holes provided in the first insulating layer PAS1 and thus may be connected to the first electrodes RME1. In an embodiment, for example, the contact holes of the first insulating layer PAS1 may be provided on the protruding patterns BP, but the present disclosure is not limited thereto. An end of each of the first contact electrodes CTE1 may be connected to a first electrode RME1 on a protruding pattern BP, and the other end of each of the first contact electrodes CTE1 may be connected to the first ends of the light emitting elements ED.

The second contact electrodes CTE2 may be disposed on the first insulating layer PAS1 and may be inserted into contact holes provided in the first insulating layer PAS1 and thus may be connected to the second electrodes RME2. In an embodiment, for example, the contact holes of the first insulating layer PAS1 may be provided on the protruding patterns BP, but the present disclosure is not limited thereto. An end of each of the second contact electrodes CTE2 may be connected to the second ends of the light emitting elements ED, and the other end of each of the second contact electrodes CTE1 may be connected to a second electrode RME2 on a protruding pattern BP.

The third insulating layer PAS3 may be disposed on the first and second contact electrodes CTE1 and CTE2, the sub-bank SB, and the first and second insulating layers PAS1 and PAS2. The third insulating layer PAS3 may be disposed on the light emitting element layer EML to protect the light emitting element layer EML.

The wavelength conversion layer WLCL (or color control layer) may be disposed on the light emitting element layer EML. The wavelength conversion layer WLCL may include a first light blocking member BK1, a first wavelength conversion part WLC1, a second wavelength conversion part WLC2, a light transmission part LTU, a second passivation layer PV2, and a second planarization layer OC2.

The first light blocking member BK1 may be disposed on the third insulating layer PAS3 in the light blocking area BA. The first light blocking member BK1 may overlap the sub-bank SB in the thickness direction (Z-axis direction). The first light blocking member BK1 may block transmission of light. The first light blocking member BK1 may reduce or effectively prevent color mixing by preventing intrusion of light between the first through third light emitting areas LA1 through LA3, thereby improving a color gamut of the display device 10. The first light blocking member BK1 may be disposed in a lattice shape surrounding the first through third light emitting areas LA1 through LA3 in a plan view.

The first wavelength conversion part WLC1 may be disposed on the third insulating layer PAS3 in the first light emitting area LA1. The first wavelength conversion part WLC1 may be surrounded by the first light blocking member BK1. The first wavelength conversion part WLC1 may include a first base resin BS1, first scatterers SCT1, and first wavelength shifters WLS1.

The first base resin BS1 may include a material having a relatively high light transmittance. The first base resin BS1 may include or be made of a transparent organic material. In an embodiment, for example, the first base resin BS1 may include at least one of organic materials such as epoxy resin, acrylic resin, card resin, and imide resin.

The first scatterers SCT1 may have a refractive index different from that of the first base resin BS1 and may form an optical interface with the first base resin BS 1. In an embodiment, for example, the first scatterers SCT1 may include a light scattering material or light scattering particles that scatter at least a part of transmitted light. In an embodiment, for example, the first scatterers SCT1 may include metal oxide such as titanium oxide ($TiO_2$), zirconium oxide ($ZrO_2$), aluminum oxide ($Al_2O_3$), indium oxide ($In_2O_3$), zinc oxide (ZnO) or tin oxide ($SnO_2$) or may include organic particles such as acrylic resin or urethane resin. The first scatterers SCT1 may scatter incident light in random directions regardless of the incident direction of the incident light without substantially converting the peak wavelength of the incident light.

The first wavelength shifters WLS1 may convert or shift the peak wavelength of incident light into a first peak wavelength. In an embodiment, for example, the first wavelength shifters WLS1 may convert blue light provided by the display device 10 into red light having a single peak wavelength of about 610 nm to about 650 nm and emit the red light. The first wavelength shifters WLS1 may be quantum dots, quantum rods, or phosphors. The quantum dots may be particulate materials that emit light of a color when electrons transition from a conduction band to a valence band.

A part of blue light provided by the light emitting element layer EML may be transmitted through the first wavelength conversion part WLC1 without being converted into red light by the first wavelength shifters WLS1. Of the blue light provided by the light emitting element layer EML, light incident on a first color filter CF1 without being converted by the first wavelength conversion part WLC1 may be blocked by the first color filter CF1. In addition, red light into which the blue light provided by the light emitting element layer EML has been converted by the first wavelength conversion part WLC1 may be emitted to the outside through the first color filter CF1. Therefore, the first light emitting area LA1 may emit red light.

The second wavelength conversion part WLC2 may be disposed on the third insulating layer PAS3 in the second light emitting area LA2. The second wavelength conversion part WLC2 may be surrounded by the first light blocking member BK1. The second wavelength conversion part WLC2 may include a second base resin BS2, second scatterers SCT2, and second wavelength shifters WLS2.

The second base resin BS2 may include a material having a relatively high light transmittance. The second base resin BS2 may be made of a transparent organic material. In an embodiment, for example, the second base resin BS2 may be made of the same material as the first base resin BS1 or may be made of any of the materials exemplified in the description of the first base resin BS1.

The second scatterers SCT2 may have a refractive index different from that of the second base resin BS2 and may form an optical interface with the second base resin BS2. In an embodiment, the second scatterers SCT2 may include a light scattering material or light scattering particles that scatter at least a part of transmitted light. In an embodiment, for example, the second scatterers SCT2 may be made of the same material as the first scatterers SCT1 or may be made of any of the materials exemplified in the description of the first scatterers SCT1.

The second wavelength shifters WLS2 may convert or shift the peak wavelength of incident light into a second peak wavelength different from the first peak wavelength of the first wavelength shifters WLS1. In an embodiment, for example, the second wavelength shifters WLS2 may convert blue light provided by the display device 10 into green light having a single peak wavelength of about 510 nm to about 550 nm and emit the green light. The second wavelength shifters WLS2 may be quantum dots, quantum rods, or phosphors.

The second wavelength shifters WLS2 may include any of the materials exemplified in the description of the first wavelength shifters WLS1. The second wavelength shifters WLS2 may be made of quantum dots, quantum rods, or phosphors such that their wavelength conversion range is different from the wavelength conversion range of the first wavelength shifters WLS1.

The light transmission part LTU may be disposed on the third insulating layer PAS3 in the third light emitting area LA3. The light transmission part LTU may be surrounded by the first light blocking member BK1. The light transmission part LTU may transmit incident light while maintaining the peak wavelength of the incident light. The light transmission part LTU may include a third base resin BS3 and third scatterers SCT3.

The third base resin BS3 may include a material having a relatively high light transmittance. The third base resin BS3 may be made of a transparent organic material. In an embodiment, for example, the third base resin BS3 may be made of the same material as the first or second base resin BSl or BS2 or may be made of any of the materials exemplified in the description of the first base resin BS1.

The third scatterers SCT3 may have a refractive index different from that of the third base resin BS3 and may form an optical interface with the third base resin BS3. In an embodiment, for example, the third scatterers SCT3 may include a light scattering material or light scattering particles that scatter at least a part of transmitted light. In an embodiment, for example, the third scatterers SCT3 may be made of the same material as the first or second scatterers SCT1 or SCT2 or may be made of any of the materials exemplified in the description of the first scatterers SCT1.

Since the wavelength conversion layer WLCL is directly disposed on the third insulating layer PAS3 of the light emitting element layer EML, the display device 10 may not require a separate substrate for the first and second wavelength conversion parts WLC1 and WLC2 and the light transmission part LTU. Therefore, the first and second wavelength conversion parts WLC1 and WLC2 and the light transmission part LTU can be easily aligned in the first through third light emitting areas LA1 through LA3, respectively, and the thickness of the display device 10 can be relatively reduced.

The second passivation layer PV2 may cover the first and second wavelength conversion parts WLC1 and WLC2, the light transmission part LTU, and the first light blocking member BK1. In an embodiment, for example, the second passivation layer PV2 may reduce or effectively prevent damage to or contamination of the first and second wavelength conversion parts WLC1 and WLC2 and the light transmission part LTU by sealing the first and second wavelength conversion parts WLC1 and WLC2 and the light transmission part LTU. In an embodiment, for example, the second passivation layer PV2 may include an inorganic material.

The second planarization layer OC2 may be disposed on the second passivation layer PV2 to planarize the tops of the first and second wavelength conversion parts WLC1 and WLC2 and the light transmission part LTU. In an embodiment, for example, the second planarization layer OC2 may include an organic insulating material such as polyimide (PI).

The color filter layer CFL may be disposed on the wavelength conversion layer WLCL. The color filter layer CFL may include a second light blocking member BK2, first through third color filters CF1 through CF3, and a third passivation layer PV3.

The second light blocking member BK2 may be disposed on the second planarization layer OC2 of the wavelength conversion layer WLCL in the light blocking area BA. The second light blocking member BK2 may overlap the first light blocking member BK1 or the sub-bank SB in the thickness direction (Z-axis direction). The second light blocking member BK2 may block transmission of light. The second light blocking member BK2 may reduce or effectively prevent color mixing by preventing intrusion of light between the first through third light emitting areas LA1 through LA3, thereby improving the color gamut of the display device 10. The second light blocking member BK2 may be disposed in a lattice shape surrounding the first through third light emitting areas LA1 through LA3 in a plan view.

The first color filter CF1 may be disposed on the second planarization layer OC2 in the first light emitting area LA1. The first color filter CF1 may be surrounded by the second light blocking member BK2. The first color filter CF1 may overlap the first wavelength conversion part WLC1 in the thickness direction (Z-axis direction). The first color filter CF1 may selectively transmit light of the first color (e.g., red light) and block or absorb light of the second color (e.g., green light) and light of the third color (e.g., blue light). In an embodiment, for example, the first color filter CF1 may be a red color filter and may include a red colorant.

The second color filter CF2 may be disposed on the second planarization layer OC2 in the second light emitting area LA2. The second color filter CF2 may be surrounded by the second light blocking member BK2. The second color filter CF2 may overlap the second wavelength conversion part WLC2 in the thickness direction (Z-axis direction). The second color filter CF2 may selectively transmit light of the second color (e.g., green light) and block or absorb light of the first color (e.g., red light) and light of the third color (e.g., blue light). In an embodiment, for example, the second color filter CF2 may be a green color filter and may include a green colorant.

The third color filter CF3 may be disposed on the second planarization layer OC2 in the third light emitting area LA3. The third color filter CF3 may be surrounded by the second light blocking member BK2. The third color filter CF3 may overlap the light transmission part LTU in the thickness direction (Z-axis direction). The third color filter CF3 may selectively transmit light of the third color (e.g., blue light) and block or absorb light of the first color (e.g., red light) and light of the second color (e.g., green light). In an embodiment, for example, the third color filter CF3 may be a blue color filter and may include a blue colorant.

The first through third color filters CF1 through CF3 may absorb a part of light coming from outside of the display device 10, thereby reducing reflected light due to the external light. Therefore, the first through third color filters CF1 through CF3 may reduce or effectively prevent color distortion due to reflection of external light.

Since the first through third color filters CF1 through CF3 are directly disposed on the second planarization layer OC2 of the wavelength conversion layer WLCL, the display device 10 may not require a separate substrate for the first through third color filters CF1 through CF3. Therefore, the thickness of the display device 10 can be relatively reduced.

The third passivation layer PV3 may cover the first through third color filters CF1 through CF3. The third passivation layer PV3 may protect the first through third color filters CF1 through CF3.

The encapsulation layer TFE may be disposed on the third passivation layer PV3 of the color filter layer CFL. The encapsulation layer TFE may cover upper and side surfaces of the display layer DPL. In an embodiment, for example, the encapsulation layer TFE may include at least one inorganic layer to reduce or effectively prevent penetration of oxygen or moisture. In addition, the encapsulation layer TFE may include at least one organic layer to protect the display device 10 from foreign substances such as dust.

The antireflection layer ARF may be disposed on the encapsulation layer TFE. The antireflection layer ARF may reduce a decrease in visibility due to reflection of external light by reducing or effectively preventing reflection of the external light. The antireflection layer ARF may protect an upper surface of the display device 10. The antireflection layer ARF can be omitted. In an embodiment, for another example, the antireflection layer ARF may be replaced with a polarizing film.

The flexible film FPCB may be disposed under the first substrate SUB1. The flexible film FPCB may be attached to the lower surface of the first substrate SUB1 using an adhesive member ADM. Optionally, the adhesive member ADM may be omitted. An edge of the flexible film FPCB may be adjacent to the first contact hole CNT1 (e.g., a first edge which is closest to the first contact hole CNT1). The flexible film FPCB may include a lead electrode LDE disposed on a side of a lower surface which corresponds to the first edge. The lead electrode LDE may be adjacent to the first contact hole CNT1. The flexible film FPCB may support the data driver DIC disposed on the other side of the lower surface (e.g., closest to a second edge opposite to the first edge). The lead electrode LDE may be electrically connected to the data driver DIC through a lead line (not illustrated) disposed on the lower surface of the flexible film FPCB. The lead electrode LDE may be electrically connected to the bump connection electrode SCM and the pad part PD through the bump electrode SDB. The other side of the flexible film FPCB may be connected to a source circuit board (not illustrated) under the first substrate SUB1. The flexible film FPCB may transmit a signal of the data driver DIC to the display device 10.

The data driver DIC may be an integrated circuit. The data driver DIC may convert digital video data into analog data voltages based on a data control signal of a timing controller (not illustrated) and may supply the analog data voltages to the data lines of the display area DA through the flexible film FPCB. The display device 10 including the pad part PD disposed on the first substrate SUB1 and the flexible film FPCB disposed under the first substrate SUB1 may minimize the planar area of the non-display area NDA in a plan view (e.g., view along the third direction).

The bump electrode SDB may be disposed under the first substrate SUB1. A first side of the bump electrode SDB may cover at least a part of the lead electrode LDE, and the a second side (e.g., other side) of the bump electrode SDB which opposes the first side may be inserted into the first contact hole CNT1 to contact the lower surface of the bump connection electrode SCM. In an embodiment, for example, the bump electrode SDB may include at least one of tin (Sn), silver (Ag), copper (Cu), gold (Au), and nickel (Ni).

In FIG. 4, a distance L1 between a lower end of the bump electrode SDB which is furthest from the first substrate SUB1 and the lower surface of the first substrate SUB1 may be greater than a distance L2 between a lower surface of the lead electrode LDE which is furthest from the first substrate SUB1 and the lower surface of the first substrate SUB1 (L1>L2). The distance L2 between the lower surface of the lead electrode LDE and the lower surface of the first substrate SUB1 may be the sum of thicknesses of the adhesive member ADM, the flexible film FPCB, and the lead electrode LDE. Therefore, the bump electrode SDB may be in the first contact hole CNT1 and extend outside of the first contact hole CNT1 to cover at least a part of the lead electrode LDE.

The bump electrode SDB may be a solder ball. In an embodiment, for example, a material of the bump electrode SDB may be heated to form a solder ball in a liquid state and, in the liquid state, may cover the lead electrode LDE and the first contact hole CNT1. The bump electrode SDB may be cooled and solidified after being disposed between the lead electrode LDE and the bump connection electrode SCM. The bump electrode SDB may be formed without using a thermocompression process. The bump electrode SDB may electrically connect the lead electrode LDE of the flexible film FPCB to the bump connection electrode SCM on the first substrate SUB1, where the lead electrode LDE and the bump connection electrode SCM are on opposing sides of the first substrate SUB1. That is, a corresponding bump electrode SDB among the plurality of bump electrodes SDB electrically connects a corresponding lead electrode LDE among the plurality of lead electrodes LDE to a corresponding bump connection electrode SCM among the plurality of bump connection electrodes SCM. Therefore, the display device 10 may electrically connect the flexible film FPCB disposed under the first substrate SUB1 and the pad part PD disposed above the first substrate SUB1 without using an anisotropic conductive film.

Since the flexible film FPCB is overlapped by the display area DA in the thickness direction (Z-axis direction), if the flexible film FPCB is electrically connected to the pad part PD using an anisotropic conductive film in a conventional structure, the display area DA may be damaged, thus deteriorating visibility. However, since one or more embodiment of the display device 10 electrically connects the flexible film FPCB and the pad part PD using the bump electrode SDB, damage to the display area DA can be reduced or effectively prevented, and visibility of the display device 10 can be improved.

FIGS. 6 through 12 are cross-sectional views illustrating an embodiment of a process of providing or manufacturing a display device.

Figure 6:
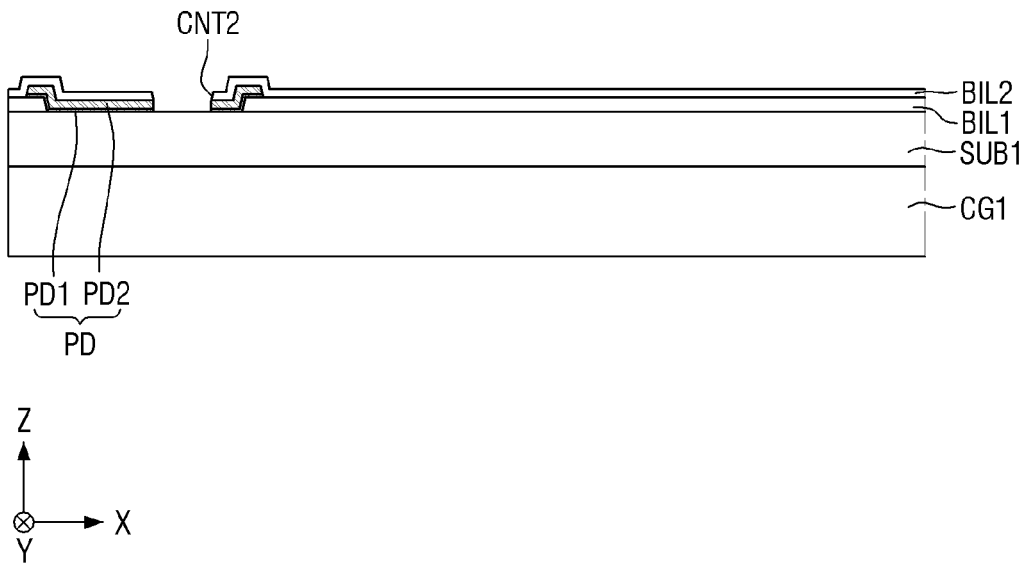
FIGS. 6 through 12 are cross-sectional views illustrating an embodiment of a process of providing a display device.

In FIG. 6, a first carrier substrate CG1 may support a display device 10 during the process of manufacturing the display device 10. In an embodiment, for example, the first carrier substrate CG1 may be, but is not limited to, a carrier glass.

A first substrate SUB1 may be disposed on the first carrier substrate CG1. The first substrate SUB1 may be a base substrate or a base member. The first substrate SUB1 may include, but is not limited to, an insulating material such as polymer resin (e.g., polyimide (PI)).

A first barrier insulating layer BIL1 may be disposed on the first substrate SUB1. The first barrier insulating layer BIL1 may include an inorganic layer that can reduce or effectively prevent penetration of air or moisture. In an embodiment, for example, the first barrier insulating layer BIL1 may be patterned on the first substrate SUB1 through a photo process, a wet etching process, and a stripping process, but the present disclosure is not limited thereto.

A pad part PD may be disposed on the first substrate SUB1. Edges of the pad part PD may cover edges of the first barrier insulating layer BIL1. Therefore, the pad part PD may be formed after the first barrier insulating layer BIL1 is patterned on the first substrate SUB1. In an embodiment, for example, the pad part PD may be patterned on the first substrate SUB1 through a photo process, a wet etching process, and a stripping process, but the present disclosure is not limited thereto.

The pad part PD may be disposed in a display area DA or may be disposed in the display area DA and extend from the display area DA to a non-display area NDA. Since the display device 10 includes the pad part PD having at least a part disposed in the display area DA, the area of the non-display area NDA can be minimized. In an embodiment, for example, the pad part PD may be a single layer or a multilayer made of any one or more of molybdenum (Mo), aluminum (Al), chromium (Cr), gold (Au), silver (Ag), titanium (Ti), nickel (Ni), neodymium (Nd), copper (Cu), and alloys of the same.

The pad part PD may include a lower electrode PD1 and an upper electrode PD2. A lower surface of the lower electrode PD1 may contact an upper surface of the first substrate SUB1. In an embodiment, for example, the lower electrode PD1 may include titanium (Ti) and thus may be easily attached onto the first substrate SUB1 including polyimide (PI), but the material of the lower electrode PD1 is not limited thereto.

The upper electrode PD2 may be disposed on the lower electrode PD1. A thickness of the upper electrode PD2 may be greater than a thickness of the lower electrode PD1, The thickness of the upper electrode PD2 may be. but is not limited to, ten times or more of the thickness of the lower electrode PD1. in an embodiment, for example, the upper electrode PD2 may include copper (Cu), but the material of the upper electrode PD2 is not limited thereto.

A second barrier insulating layer BIL2 may be disposed on the first barrier insulating layer BIL1 and the pad part PD. The second barrier insulating layer BIL2 may include an inorganic layer that can reduce or effectively prevent penetration of air or moisture.

The pad part PD and the second barrier insulating layer BIL2 may include a second contact hole CNT2. The second contact hole CNT2 may be etched from an upper surface of the second barrier insulating layer BIL2 to the lower surface of the lower electrode PD1 of the pad part PD. In an embodiment, for example, the second barrier insulating layer BIL2 may be penetrated through a dry etching process, and the pad part PD may be penetrated through a wet etching process, but the present disclosure is not limited thereto. The upper surface of the first substrate SUB1 may be exposed to outside the pad part PD and the second barrier insulating layer BIL2 by the second contact hole CNT2.

Figure 7:
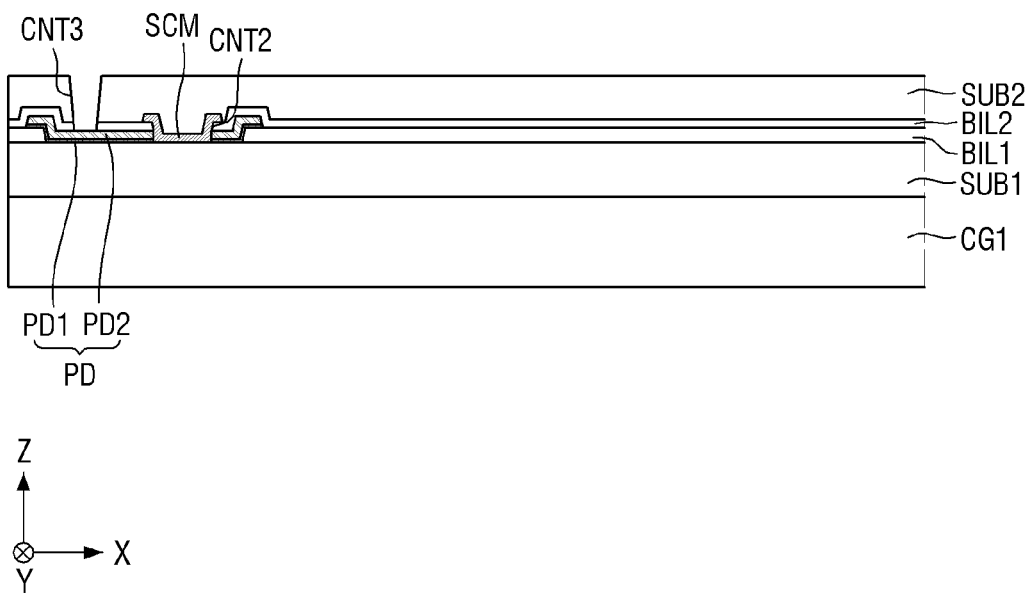

In FIG. 7, a bump connection electrode SCM may be inserted into the second contact hole CNT2. Edges of the bump connection electrode SCM may cover edges of the second barrier insulating layer BIL2 at the second contact hole CNT2. Therefore, the bump connection electrode SCM may be formed in the second contact hole CNT2 after the second barrier insulating layer BIL2 is patterned. The bump connection electrode SCM may be formed through, but not limited to, an inkjet process or a dispensing process. In an embodiment, for example, the bump connection electrode SCM may include, but is not limited to, copper (Cu) or gold (Au). The bump connection electrode SCM may be made of the same material as the upper electrode PD2 of the pad part PD, but the present disclosure is not limited thereto.

A second substrate SUB2 may be disposed on the second barrier insulating layer BIL2 and the bump connection electrode SCM. The second substrate SUB2 may be a base substrate or a base member. In an embodiment, for example, the second substrate SUB2 may include, but is not limited to, an insulating material such as polymer resin (e.g., polyimide (PI)).

The second substrate SUB2 and the second barrier insulating layer BIL2 may include a third contact hole CNT3. The third contact hole CNT3 may be etched from an upper surface of the second substrate SUB2 to a lower surface of the second barrier insulating layer BIL2. An upper surface of the upper electrode PD2 of the pad part PD may be exposed to outside the second substrate SUB2 and the second barrier insulating layer BIL2 by the third contact hole CNT3.

Figure 8:
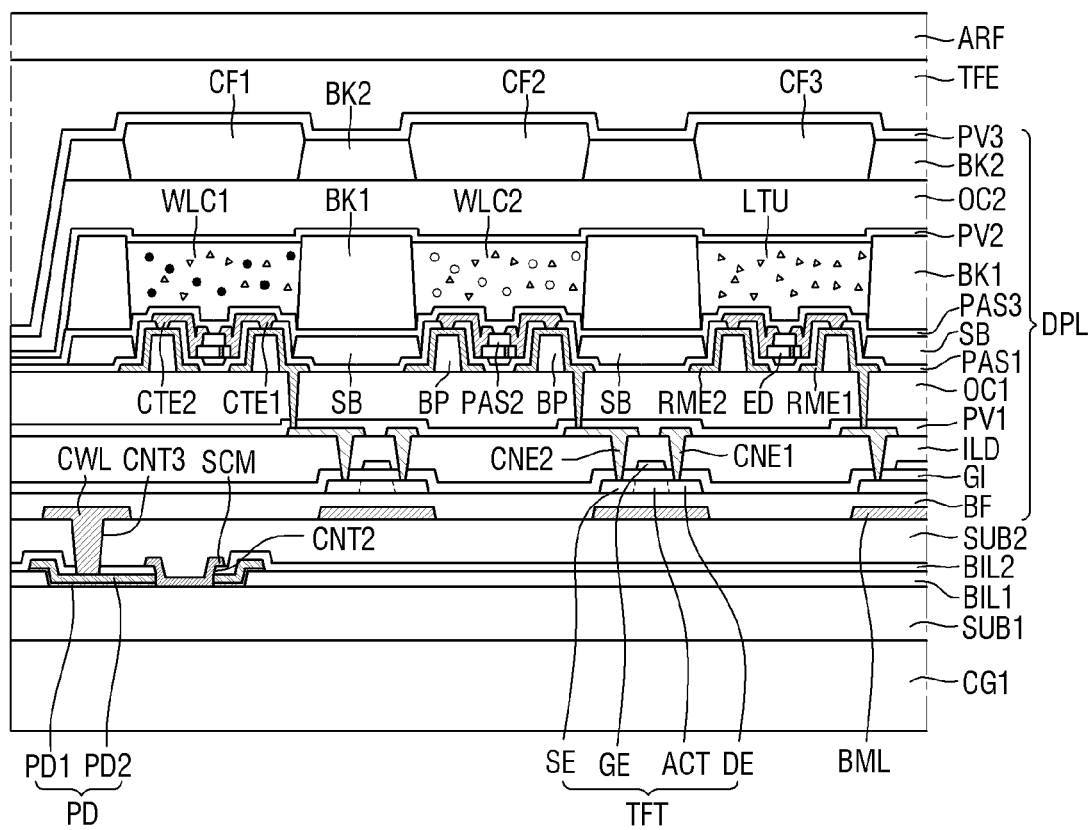

In FIG. 8, a display layer DPL may be stacked on the second substrate SUB2. A thin-film transistor layer TFTL, a light emitting element layer EML, a wavelength conversion layer WLCL, and a color filter layer CFL may be sequentially stacked on the second substrate SUB2. An encapsulation layer TFE may cover upper and side surfaces of the display layer DPL. An antireflection layer ARF may be formed on the encapsulation layer TFE.

Figure 9:
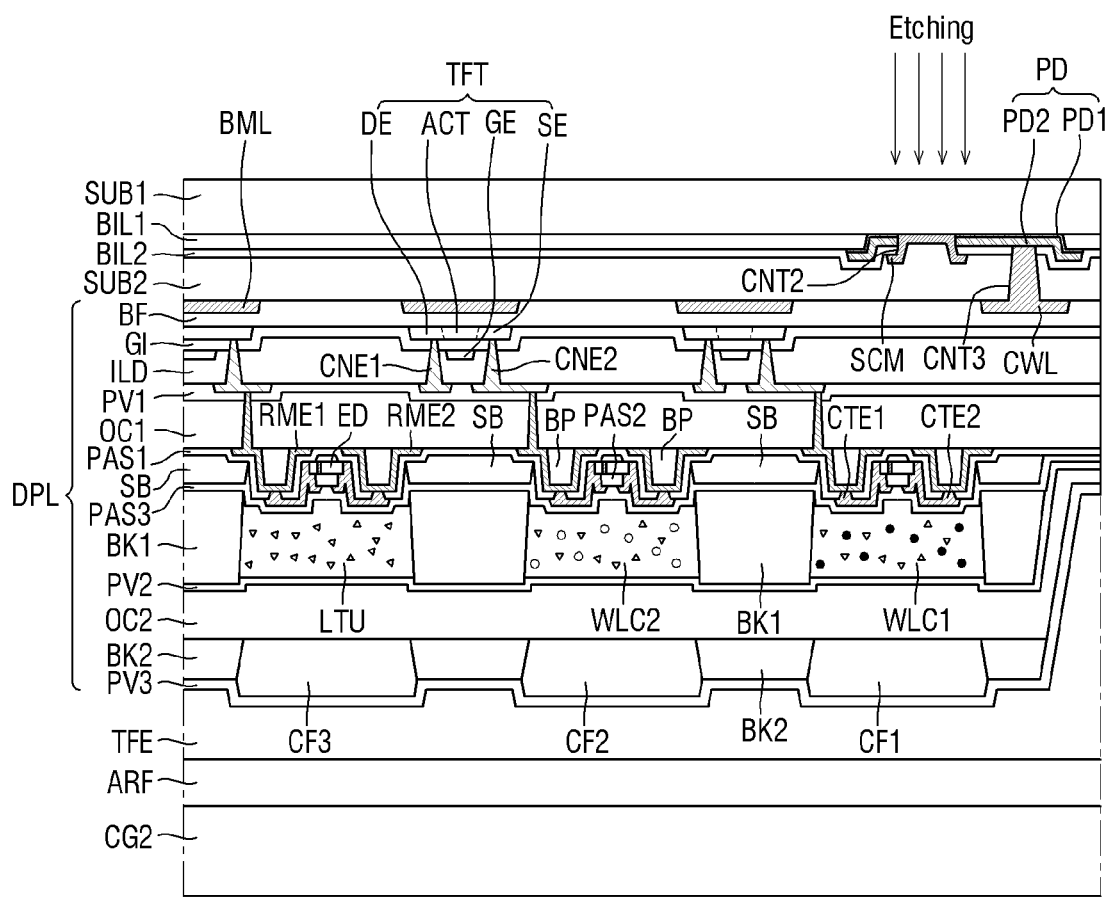
Figure 10:
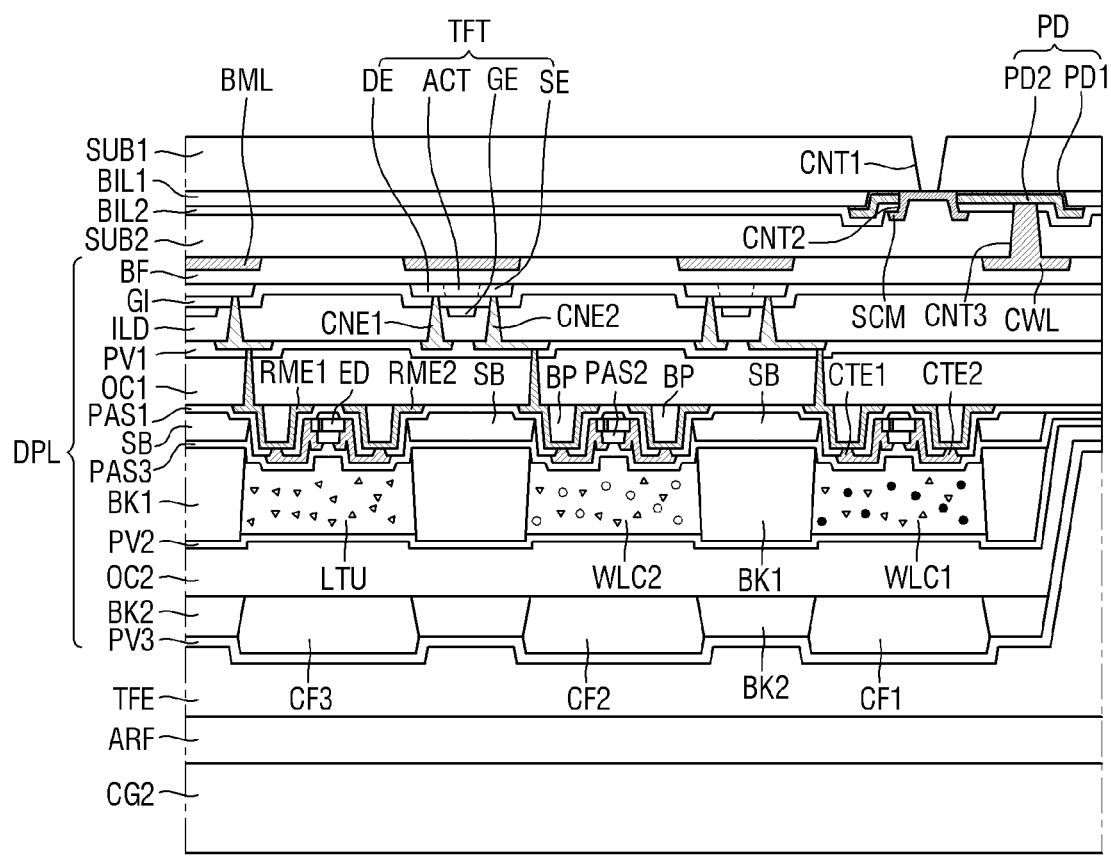

In FIGS. 9 and 10, the display device 10 being manufactured may be turned upside down to form a bump electrode SDB and a flexible film FPCB. The first carrier substrate CG1 may be removed from the first substrate SUB1. In an embodiment, for example, the first carrier substrate CG1 may be removed from a lower surface of the first substrate SUB1 using a sacrificial layer (not illustrated) disposed between the first carrier substrate CG1 and the first substrate SUB1, but the present disclosure is not limited thereto.

A second carrier substrate CG2 may be disposed on a surface of the antireflection layer ARF. The second carrier substrate CG2 may support the display device 10 which is turned upside down. In an embodiment, for example, the second carrier substrate CG2 may be, but is not limited to, a carrier glass.

At least one of a dry etching process, a plasma etching process, and a laser etching process may be performed on the first substrate SUB1 in a direction from the first substrate SUB1 to the pad part PD. In an embodiment, for example, the first substrate SUB1 may be patterned through a plasma etching process using atmospheric pressure plasma. Therefore, a first contact hole CNT1 corresponding to the pad part PD may be provided in the first substrate SUB1 and may expose the bump connection electrode SCM to outside the first substrate SUB1 (FIG. 10).

Figure 11:
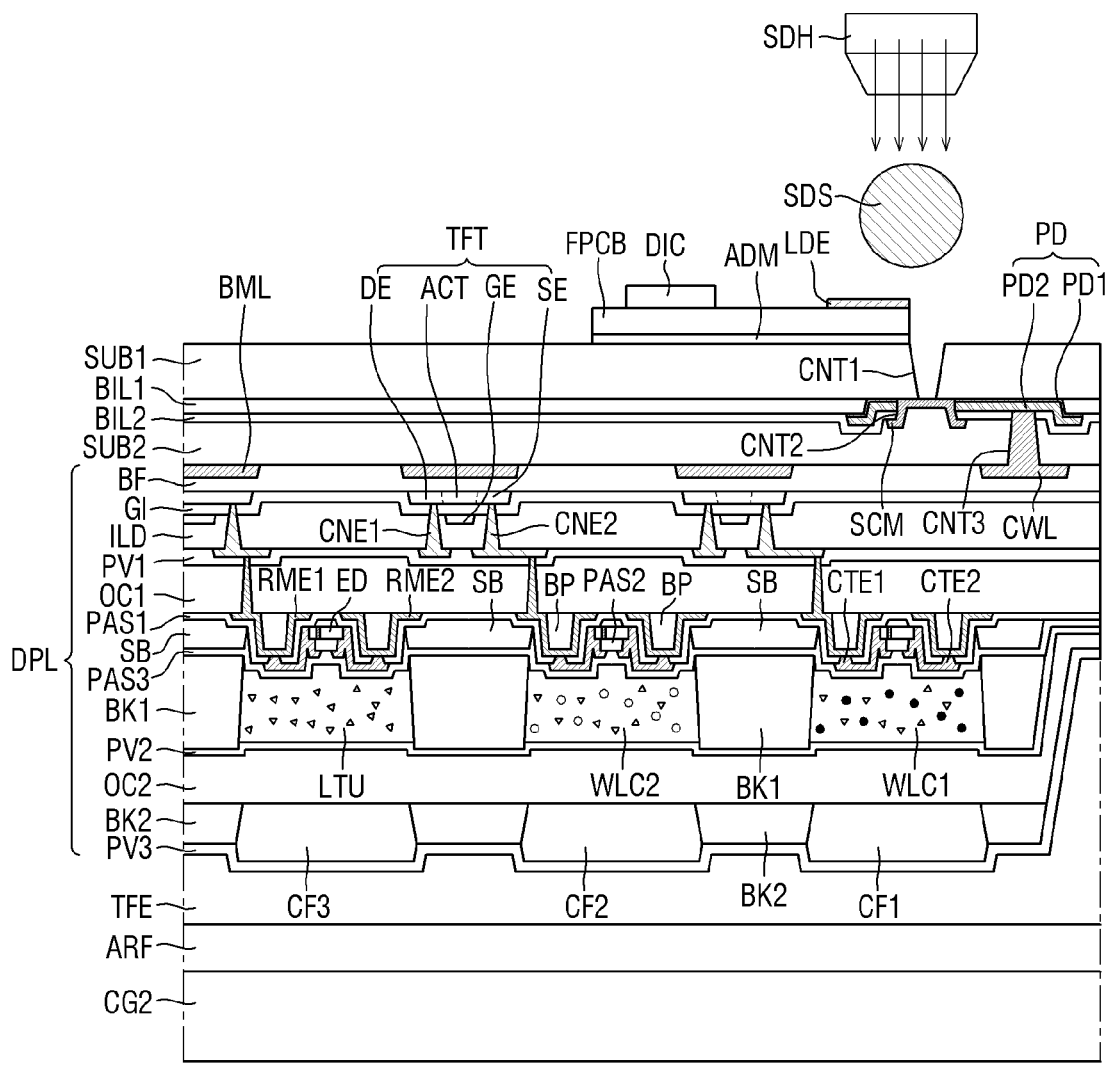
Figure 12:
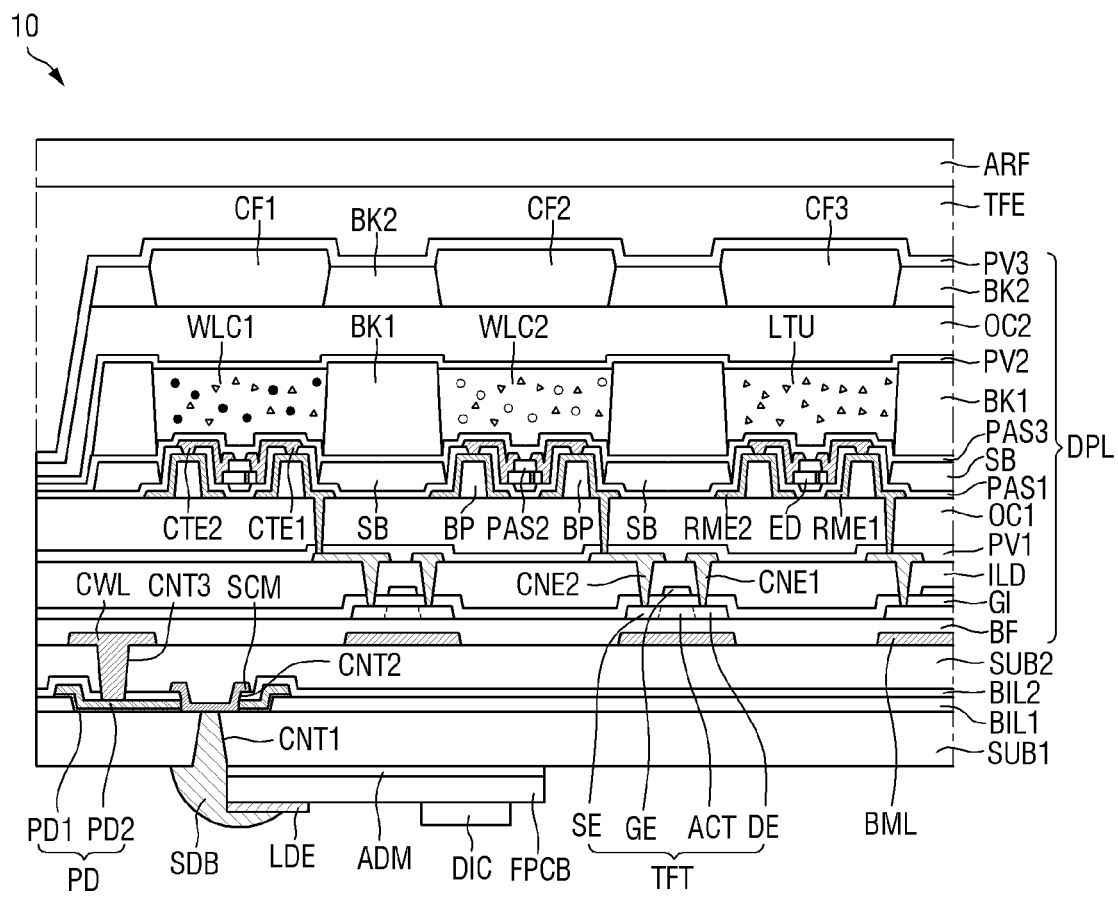

In FIGS. 11 and 12, the flexible film FPCB may be disposed on the surface of the first substrate SUB1. The flexible film FPCB may be attached onto the first substrate SUB1 using an adhesive member ADM. Optionally, the adhesive member ADM may be omitted. An edge of the flexible film FPCB may be adjacent to or closest to the first contact hole CNT1. The flexible film FPCB may include a lead electrode LDE disposed on a side thereof corresponding to the edge which is closest to the first contact hole CNT1. The flexible film FPCB may support a data driver DIC disposed on the other side thereof. The lead electrode LDE may be electrically connected to the data driver DIC through a lead line (not illustrated) disposed on the flexible film FPCB.

The bump electrode SDB may be a solder ball. The bump electrode SDB may be formed using a jet soldering process. A solder head SDH may inject a solder solution SDS including a solder material toward the lead electrode LDE and the first contact hole CNT1. The solder solution SDS may include at least one of tin (Sn), silver (Ag), copper (Cu), gold (Au), and nickel (Ni). The solder solution SDS may be heated into a liquid state and, in the liquid state, injection of the solder solution SDS may cover the lead electrode LDE and the first contact hole CNT1. The solder solution SDS may be cooled and solidified into the bump electrode SDB after being disposed between the lead electrode LDE and the bump connection electrode SCM. The bump electrode SDB may be formed without using a thermocompression process. The bump electrode SDB may electrically connect the lead electrode LDE of the flexible film FPCB to the bump connection electrode SCM on the first substrate SUB1. Therefore, the display device 10 may electrically connect the flexible film FPCB disposed under the first substrate SUB1 and the pad part PD disposed above the first substrate SUB1 without using an anisotropic conductive film.

Since the flexible film FPCB is in the display area DA along the thickness direction (Z-axis direction), if the flexible film FPCB is electrically connected to the pad part PD using an anisotropic conductive film of a conventional structure, the display area DA may be damaged, thus deteriorating visibility. However, since one or more embodiment of the display device 10 electrically connects the flexible film FPCB and the pad part PD using the bump electrode SDB, damage to the display area DA can be reduced or effectively prevented and visibility of the display device 10 can be improved.

In an embodiment, for another example, the bump electrode SDB may be formed using a solder paste process or a solder film process. Therefore, the display device 10 may electrically connect the flexible film FPCB and the pad part PD using the bump electrode SDB without using a conventional anisotropic conductive film formed through a thermal compression process.

Figure 13:
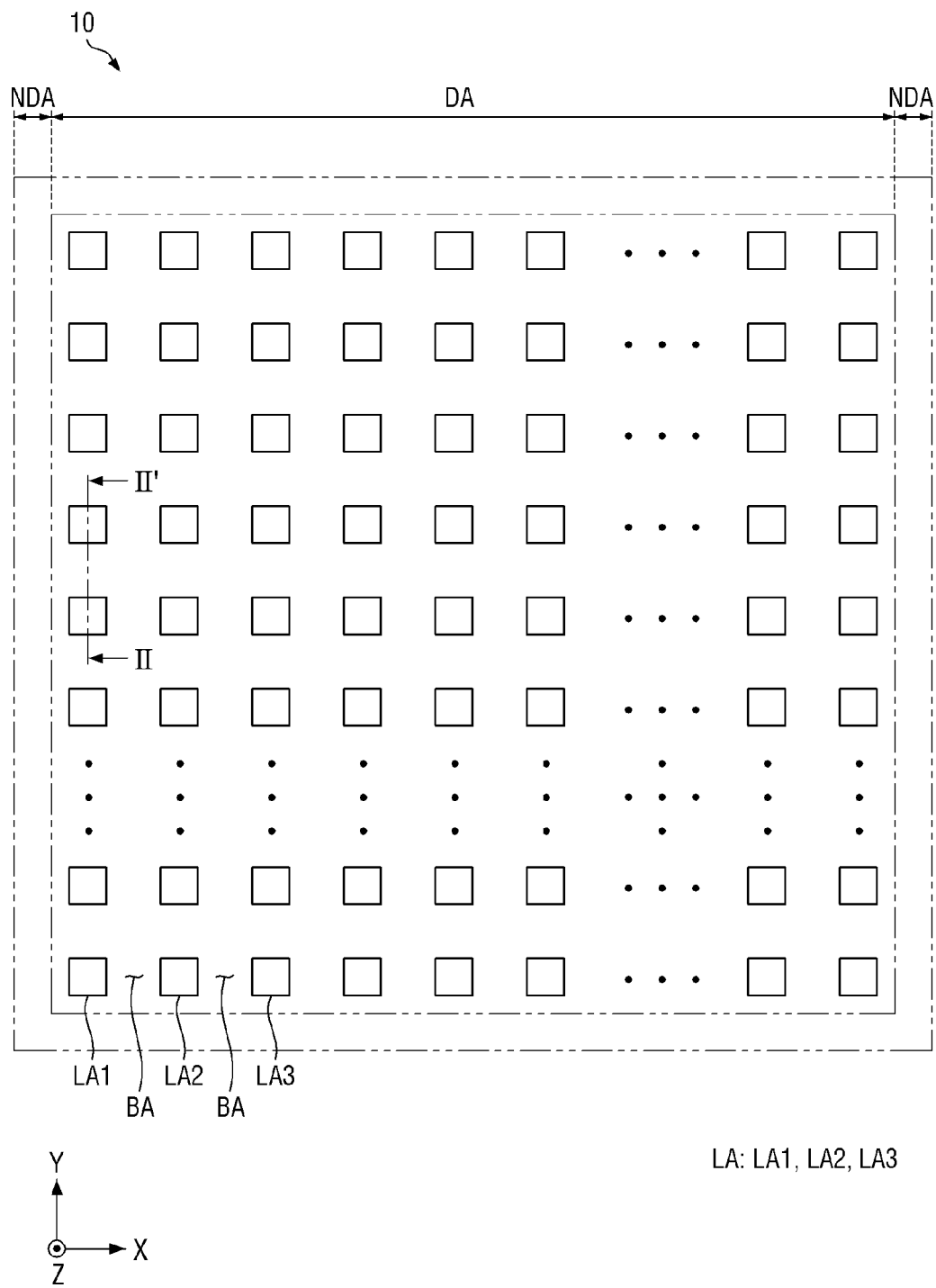
FIG. 13 is a plan view of an embodiment of a display device.
Figure 14:
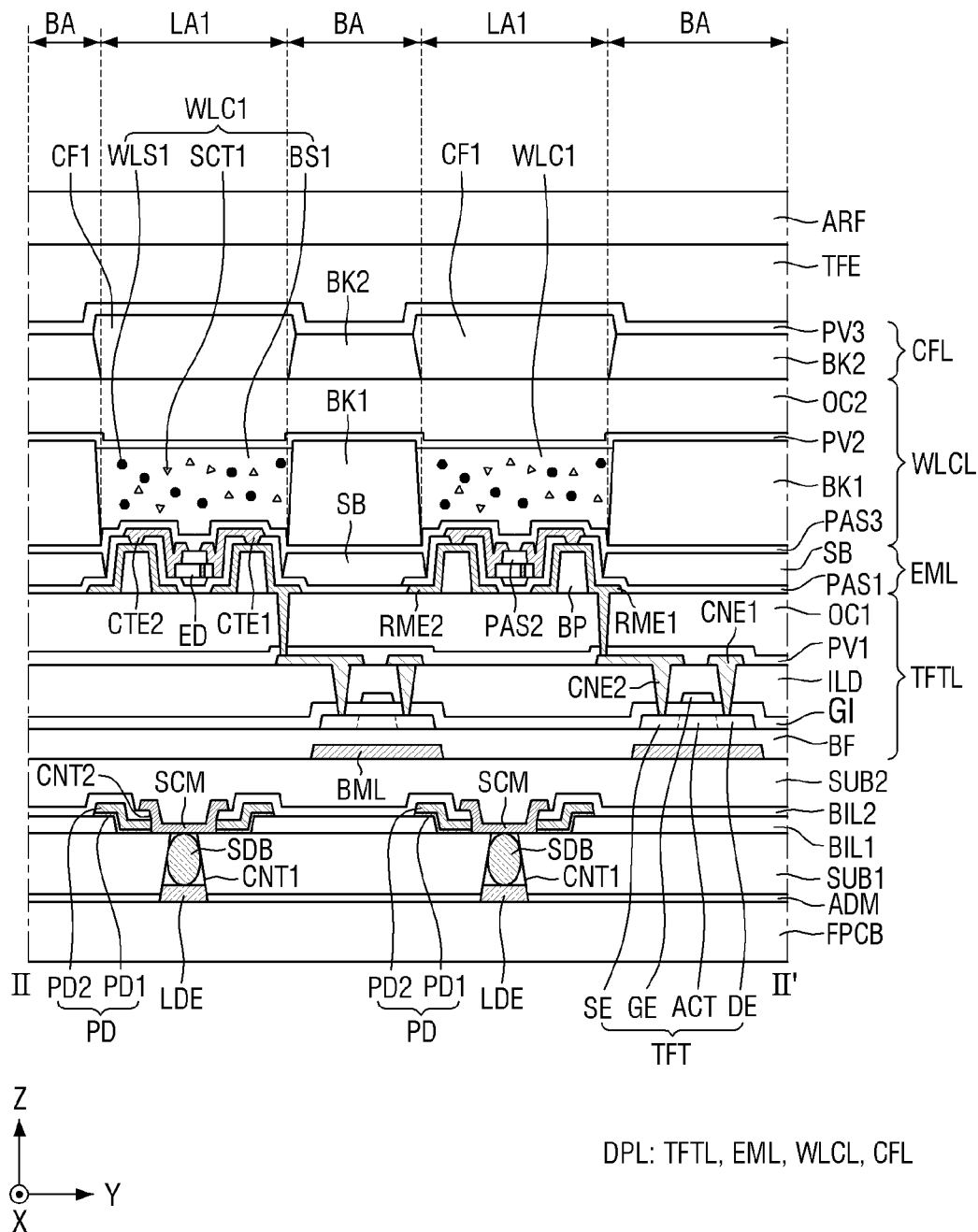
FIG. 14 is a cross-sectional view taken along line II-II' of FIG. 13.

FIG. 13 is a plan view of an embodiment of a display device 10. FIG. 14 is a cross-sectional view taken along line II-II' of FIG. 13. The display device 10 of FIGS. 13 and 14 is different from the display device 10 of FIGS. 2 and 3 in the configuration of a bump electrode SDB and a lead electrode LDE. Thus, a description of the same elements as those described above will be given briefly or omitted.

Referring to FIGS. 13 and 14, a display area DA of the display device 10 may include first through third light emitting areas LA1 through LA3. Each of the first through third light emitting areas LA1 through LA3 may be an area where light generated by a light emitting element ED of the display device 10 is emitted to outside of the display device 10

The display device 10 may include a first substrate SUB1, a first barrier insulating layer BIL1 a plurality of pad parts PD, a second barrier insulating layer BIL2, bump connection electrodes SCM, a second substrate SUB2, a display layer DPL, an encapsulation layer TFE, an antireflection layer ARF, bump electrodes SDB, and a flexible film FPCB.

The first substrate SUB1 may support the display device 10. The first substrate SUB1 may be a base substrate or a base member. The first substrate SUB1 may be a flexible substrate that can be bent, folded, rolled, etc.

The first substrate SUB1 may include a plurality of first contact holes CNT1. The first contact holes CNT1 may correspond to the pad parts PD, respectively. The first contact holes CNT1 may be spaced apart from each other in a direction along the first substrate SUB1 with solid portions of the first substrate SUB1 interposed between them. Each of the first contact holes CNT1 may be etched from a lower surface of the first substrate SUB1 to an upper surface of the first substrate SUB1. In a manufacturing process of the display device 10, lower surfaces of the bump connection electrodes SCM may be exposed to outside the first substrate SUB1 by the first contact holes CNT1, and the bump connection electrodes SCM may contact the bump electrodes SDB at the first contact holes CNT1.

The first barrier insulating layer BIL1 may be disposed on the first substrate SUB1. The first barrier insulating layer BIL1 may include an inorganic layer that can reduce or effectively prevent penetration of air or moisture.

The pad parts PD may be disposed on the first substrate SUB1. Edges of the pad parts PD may cover edges of the first barrier insulating layer BIL1 Therefore, the pad parts PD may be formed after the first barrier insulating layer BIL1 is patterned on the first substrate SUB1. The pad parts PD may be disposed in the display area DA or may be disposed over the display area DA and a non-display area NDA. Since the display device 10 includes the pad parts PD, each having at least a part disposed in the display area DA, the area of the non-display area NDA can be minimized.

The pad parts PD may electrically connect the bump connection electrodes SCM and thin-film transistors TFT of pixels. The pad parts PD may be electrically connected to the bump electrodes SDB and the flexible film FPCB through the bump connection electrodes SCM. Therefore, the pad parts PD may supply an electric signal received from the flexible film FPCB to the thin-film transistors TFT of the pixels.

Each of the pad parts PD may include a lower electrode PD1 and an upper electrode PD2. A lower surface of the lower electrode PD1. may contact the upper surface of the first substrate SUB". The lower electrode PD1 may include a material having stronger adhesion to the first substrate SUB1 than to the upper electrode PD2. In an embodiment, for example, the lower electrode PD1 may include titanium (Ti) and thus may be easily attached onto the first substrate SUB1 including polyimide (PI), but the material of the lower electrode PD1 is not limited thereto.

The upper electrode PD2 may be disposed on the lower electrode PD1. A thickness of the upper electrode PD2 may be greater than a thickness of the lower electrode PD1. In an embodiment, for example, the upper electrode PD2 may include copper (Cu), but the material of the upper electrode PD2 is not limited thereto.

The second barrier insulating layer BIL2 may be disposed on the first barrier insulating layer BIL1 and the pad pails PD. The second barrier insulating layer BIL2 may include an inorganic layer that can reduce or effectively prevent penetration of air or moisture.

The pad parts PD and the second barrier insulating layer BIL2 may include a plurality of second contact holes CNT2. The second contact holes CNT2 may overlap the first contact holes CNT1 in the thickness direction (Z-axis direction). The second contact holes CNT2 may be etched from an upper surface of the second barrier insulating layer BIL2 to the lower surfaces of the lower electrodes PD1 of the pad parts PD. In an embodiment, for example, an upper width of each of the second contact holes CNT2 may be greater than a lower width of the second contact hole CNT2. In the manufacturing process of the display device 10, the upper surface of the first substrate SUB1 may be exposed to outside pad parts PD and the second barrier insulating layer BIL2 by the second contact holes CNT2, and the bump connection electrodes SCM may fill the second contact holes CNT2.

The bump connection electrodes SCM may be inserted into the second contact holes CNT2. Edges of the bump connection electrodes SCM may cover edges of the second barrier insulating layer BIL2. Therefore, the bump connection electrodes SCM may be formed in the second contact holes CNT2 after the second barrier insulating layer BIL2 is patterned. The bump connection electrodes SCM may be surrounded by the pad parts PD in a plan view. The bump connection electrodes SCM may be formed through, but not limited to, an inkjet process or a dispensing process. A part of each of the bump connection electrodes SCM may be disposed on the first substrate SUB1, and another part of the bump connection electrode SCM may contact a bump electrode SDB inserted into a first contact hole CNT1. Each of the bump connection electrodes SCM may be a single layer or a multilayer made of any one or more of molybdenum (Mo), aluminum (Al), chromium (Cr), gold (Au), silver (Ag), titanium (Ti), nickel (Ni), neodymium (Nd), copper (Cu), and alloys of the same. The bump connection electrodes SCM may include a material haying stronger adhesion to the bump electrodes SDB than to the lower electrodes PD1 of the pad parts PD. In an embodiment, for example, the bump connection electrodes SCM may include copper (Cu) or gold (Au) and thus may be easily attached to the bump electrodes SDB inserted into the first contact holes CNT1, but the material of the bump connection electrodes SCM is not limited thereto. The bump connection electrodes SCM including copper (Cu) or gold (Au) may be easily attached to the pad parts PD. The bump connection electrodes SCM may be made of the same material as the upper electrodes PD2 of the pad parts PD, but the present disclosure is not limited thereto.

The second substrate SUB2 may be disposed on the second barrier insulating layer BIL2 and the bump connection electrodes SCM, The second substrate SUB2 may be a base substrate or a base member. The second substrate SUB2 may be a flexible substrate that can be bent, folded, rolled, etc.

The display layer DPL may be disposed on the second substrate SUB2. The display layer DPL may include a thin-film transistor layer TFTL, a light emitting element layer EML, a wavelength conversion layer WLCL, and a color filter layer CFL.

The thin-film transistor layer TFTL may be disposed on the second substrate SUB2. The thin-film transistor layer TFTL may include a light blocking layer BML, a buffer layer BF, the thin-film transistors TFT, a gate insulating layer GI, an interlayer insulating film ILD, first and second connection electrodes CNE1 and CNE2, a first passivation layer PV1, and a first planarization layer OC1.

The light emitting element layer EML may be disposed on the thin-film transistor layer TFTL. The light emitting element layer EML may include protruding patterns BP, first electrodes RME1, second electrodes RME2, a first insulating layer PAS1, a sub-bank SB, the light emitting elements ED, a second insulating layer PAS2, first contact electrodes CTE1, second contact electrodes CTE2, and a third insulating layer PAS3.

The wavelength conversion layer WLCL may be disposed on the light emitting element layer EML. The wavelength conversion layer WLCL may include a first light blocking member BK1, first wavelength conversion parts WLC1, a second passivation layer PV2, and a second planarization layer OC2.

The color filter layer CFL may be disposed on the wavelength conversion layer WLCL. The color filter layer CFL may include a second light blocking member BK2, first color filters CF1, and a third passivation layer PV3.

The encapsulation layer TFE may be disposed on the color filter layer CFL. The encapsulation layer TFE may cover upper and side surfaces of the display layer DPL. In an embodiment, for example, the encapsulation layer TFE may include at least one inorganic layer to reduce or effectively prevent penetration of oxygen or moisture. In addition, the encapsulation layer TFE may include at least one organic layer to protect the display device 10 from foreign substances such as dust.

The antireflection layer ARF may be disposed on the encapsulation layer TFE. The antireflection layer ARF may reduce a decrease in visibility due to reflection of external light by reducing or effectively preventing reflection of the external light. The antireflection layer ARF may protect an upper surface of the display device 10. The antireflection layer ARF can be omitted. In an embodiment, for another example, the antireflection layer ARF may be replaced with a polarizing film.

The bump electrodes SDB may be inserted into the first contact holes CNT1. The bump electrodes SDB may be disposed in the first contact holes CNT1, respectively, and may be insulated from each other by the first substrate SUB1. The bump electrodes SDB may be connected between lead electrodes LDE of the flexible film FPCB and the bump connection electrodes SCM. Upper parts of the bump electrodes SDB may contact the lower surfaces of the bump connection electrodes SCM, and lower parts of the bump electrodes SDB may contact upper surfaces of the lead electrodes LDE within the first contact holes CNT1. In an embodiment, for example, the bump electrodes SDB may include at least one of tin (Sn), silver (Ag), copper (Cu), gold (Au), and nickel (Ni).

The bump electrodes SDB may be solder balls. In an embodiment, for example, a material of the bump electrodes SDB may be heated to form solder balls in a liquid state and, in the liquid state, may fill the first contact holes CNT1. The bump electrodes SDB may be compressed using a relatively low pressure after being disposed between the lead electrodes LDE and the bump connection electrodes SCM. The bump electrodes SDB may be formed without using a high-pressure compression process used in a conventional process of forming an anisotropic conductive film. Therefore, the display device 10 may electrically connect the flexible film FPCB disposed under the first substrate SUB1 and the pad parts PD disposed above the first substrate SUB1 without using an anisotropic conductive film. Since the flexible film FPCB is overlapped by the display area DA in the thickness direction (Z-axis direction), if the flexible film FPCB is electrically connected to the pad parts PD using a conventional anisotropic conductive film formed by a high-pressure compression process, the display area DA may be damaged, thus deteriorating visibility. However, since one or more embodiment of the display device 10 electrically connects the flexible film FPCB and the pad parts PD using the bump electrodes SDB, damage to the display area DA can be reduced or effectively prevented and visibility of the display device 10 can be improved.

The flexible film FPCB may be disposed under the first substrate SUB1. The flexible film FPCB may be attached to the lower surface of the first substrate SUB1 using the adhesive member ADM. Optionally, the adhesive member ADM may be omitted.

The flexible film FPCB may include a plurality of lead electrodes LDE corresponding to the pad parts PD, respectively. The lead electrodes LDE may be spaced apart from each other along the flexible film FPCB. At least a part of each of the lead electrodes LDE may extend into a first contact hole CNT1 from outside the first substrate SUB1. The lead electrodes LDE may be self-aligned by insertion into the first contact holes CNT1, and the first substrate SUB1 may serve as a dam that physically holds the lead electrodes LDE.

The lead electrodes LDE, the bump electrodes SDB, and the bump connection electrodes SCM may overlap or be aligned in the thickness direction (Z-axis direction). The lead electrodes LDE may be insulated from each other by solid portions of the first substrate SUB1. The display device 10 may include the first contact holes CNT1 corresponding to the pad parts PD, respectively, each of the lead electrodes LDE may extend into a corresponding first contact hole CNT1, and one of the lead electrodes LDE may be connected to one of the pad parts PD through a bump electrode SDB. The pad parts PD or the lead electrodes LDE may be insulated from each other by the first substrate SUB1. Therefore, the display device 10 can reduce or effectively prevent a short circuit between the pad parts PD adjacent to each other or the lead electrodes LDE adjacent to each other.

The lead electrodes LDE may be electrically connected to a data driver DIC through lead lines (not illustrated) disposed on a lower surface of the flexible film FPCB. The lead electrodes LDE may be electrically connected to the bump connection electrodes SCM and the pad parts PD through the bump electrodes SDB. The flexible film FPCB may be connected to a source circuit board (not illustrated) under the first substrate SUB1. The flexible film FPCB may transmit an electric signal of the data driver DIC to the display device 10. The display device 10 including the pad parts PD disposed above the first substrate SUB1 and the flexible film FPCB disposed under the first substrate SUB1 may minimize the area of the non-display area NDA.

FIGS. 15 through 21 are cross-sectional views illustrating an embodiment of a process of providing or manufacturing a display device 10.

Figure 15:
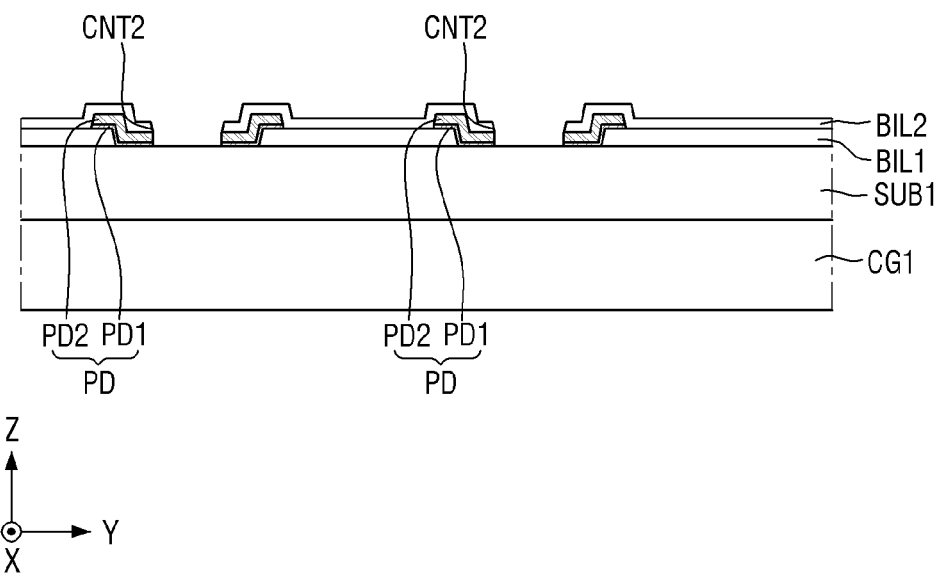
FIGS. 15 through 21 are cross-sectional views illustrating an embodiment of a process of providing a display device.

In FIG. 15, a first carrier substrate CG1 may support a display device 10 during the process of manufacturing the display device 10. In an embodiment, for example, the first carrier substrate CG1 may be, but is not limited to, a carrier glass.

A first substrate SUB1 may be disposed on the first carrier substrate CG1. The first substrate SUB1 may be a base substrate or a base member. In an embodiment, for example, the first substrate SUB1 may include, but is not limited to, an insulating material such as polymer resin (e.g., polyimide (PI)).

A first barrier insulating layer BIL1 may be disposed on the first substrate SUB1. The first barrier insulating layer BIL1 may include an inorganic layer that can reduce or effectively prevent penetration of air or moisture. In an embodiment, for example, the first barrier insulating layer BIL1 may be patterned on the first substrate SUB1 through a photo process, a wet etching process, and a stripping process, but the present disclosure is not limited thereto.

A plurality of pad parts PD may be disposed on the first substrate SUB1. The pad parts PD may be insulated from each other by solid portions of the first and second barrier insulating layers BIL1 and BIL2. Edges of the pad parts PD may cover edges of the first barrier insulating layer BIL1. Therefore, the pad parts PD may be formed after the first barrier insulating layer BIL1 is patterned on the first substrate SUB1. In an embodiment, for example, the pad parts PD may be patterned on the first substrate SUB1 through a photo process, a wet etching process, and a stripping process, but the present disclosure is not limited thereto.

The pad parts PD may be disposed in a display area DA or may be disposed over the display area DA and a non-display area NDA. Since the display device 10 includes the pad parts PD, each having at least a part disposed in the display area DA, the area of the non-display area NDA can be minimized. In an embodiment, for example, each of the pad parts PD may be a single layer or a multilayer made of any one or more of molybdenum (Mo), aluminum (Al), chromium (Cr), gold (Au), silver (Ag), titanium (Ti), nickel (Ni), neodymium (Nd), copper (Cu), and alloys of the same.

Each of the pad parts PD may include a lower electrode PD1 and an upper electrode PD2. A lower surface of the lower electrode PD1 may contact an upper surface of the first substrate SUB1. In an embodiment, for example, the lower electrode PD1 may include titanium (Ti) and thus may be easily attached onto the first substrate SUB1 including polyimide (PI), but the material of the lower electrode PD1 is not limited thereto.

The upper electrode PD2 may be disposed on the lower electrode PD1. A thickness of the upper electrode PD2 may be greater than a thickness of the lower electrode PD1. In an embodiment, for example, the upper electrode PD2 may include copper (Cu), but the material of the upper electrode PD2 is not limited thereto.

The second barrier insulating layer BIL2 may be disposed on the first harrier insulating layer BIL1 and the pad parts PD. The second barrier insulating layer BIL2 may include an inorganic layer that can reduce or effectively prevent penetration of air or moisture.

The pad parts PD and the second barrier insulating layer BIL2 may include second contact holes CNT2. The second contact holes CNT2 may be etched from an upper surface of the second barrier insulating layer BIL2 to the lower surfaces of the lower electrodes PD1 of the pad parts PD. In an embodiment, for example, the second barrier insulating layer BIL2 may be penetrated through a dry etching process, and the pad parts PD may be penetrated through a wet etching process, but the present disclosure is not limited thereto. The upper surface of the first substrate SUB1 may be exposed by the second contact holes CNT2.

Figure 16:
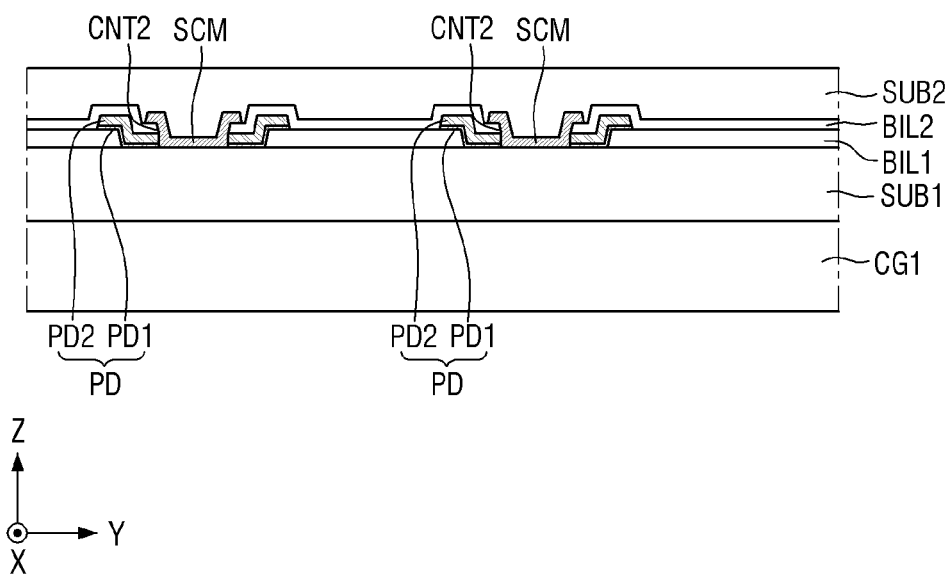

In FIG. 16, bump connection electrodes SCM may be inserted into the second contact holes CNT2. Edges of the bump connection electrodes SCM may cover edges of the second barrier insulating layer BIL2. Therefore, the bump connection electrodes SCM may be formed in the second contact holes CNT2 after the second barrier insulating layer BIL2 is patterned. The bump connection electrodes SCM may be formed through, but not limited to, an inkjet process or a dispensing process. In an embodiment, for example, the bump connection electrodes SCM may include, but are not limited to, copper (Cu) or gold (Au). The bump connection electrodes SCM may be made of the same material as the upper electrodes PD2 of the pad parts PD, but the present disclosure is not limited thereto.

A second substrate SUB2 may be disposed on the second barrier insulating layer BIL2 and the bump connection electrodes SCM. The second substrate SUB2 may be a base substrate or a base member. In an embodiment, for example, the second substrate SUB2 may include, but is not limited to, an insulating material such as polymer resin (e.g., polyimide (PI)).

Figure 17:
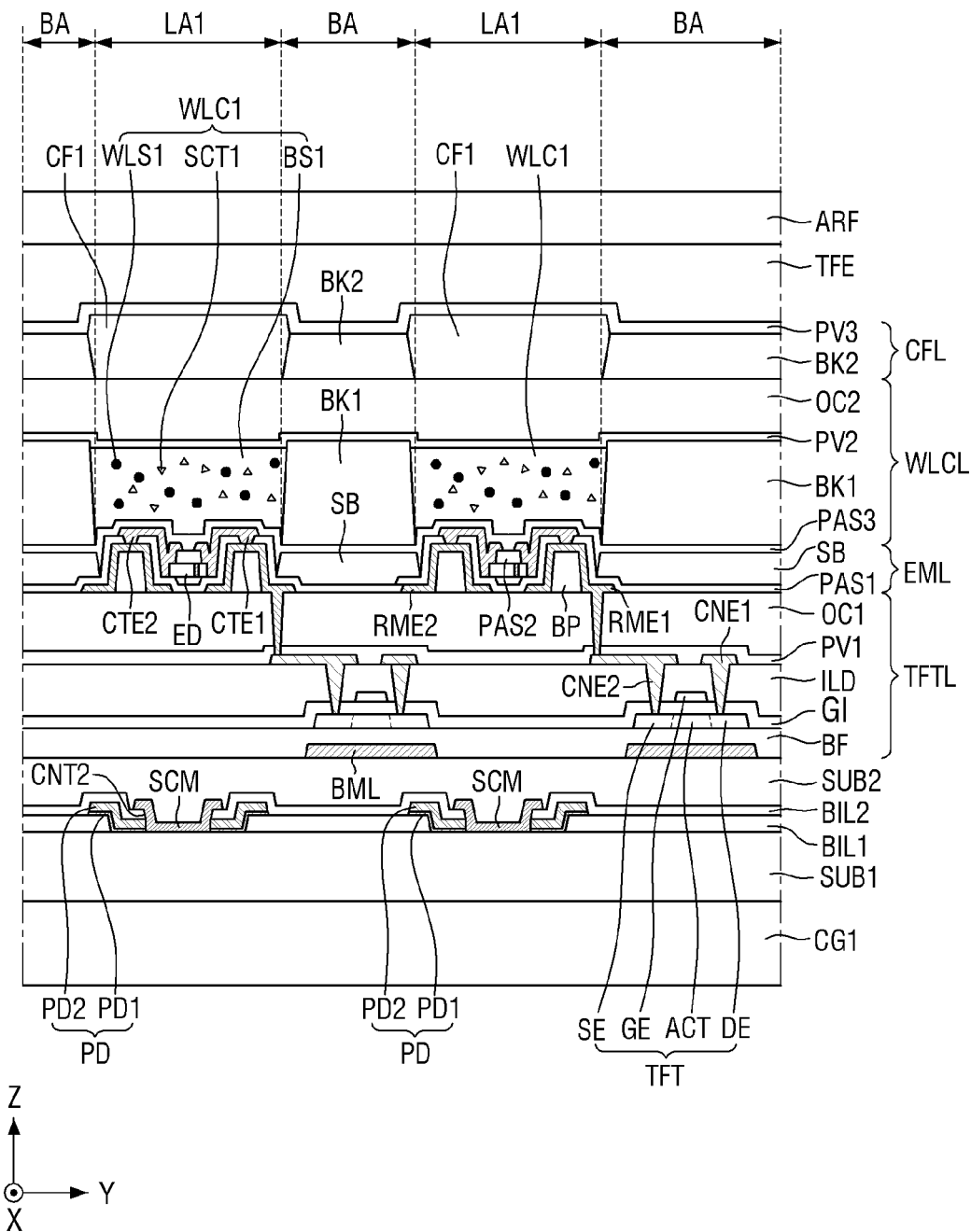

In FIG. 17, a display layer DPL may be stacked on the second substrate SUB2. A thin-film transistor layer TFTL, a light emitting element layer EML, a wavelength conversion layer WLCL, and a color filter layer CFL may be sequentially stacked on the second substrate SUB2. An encapsulation layer TFE may cover upper and side surfaces of the display layer DPL. An antireflection layer ARF may be formed on the encapsulation layer TFE.

Figure 18:
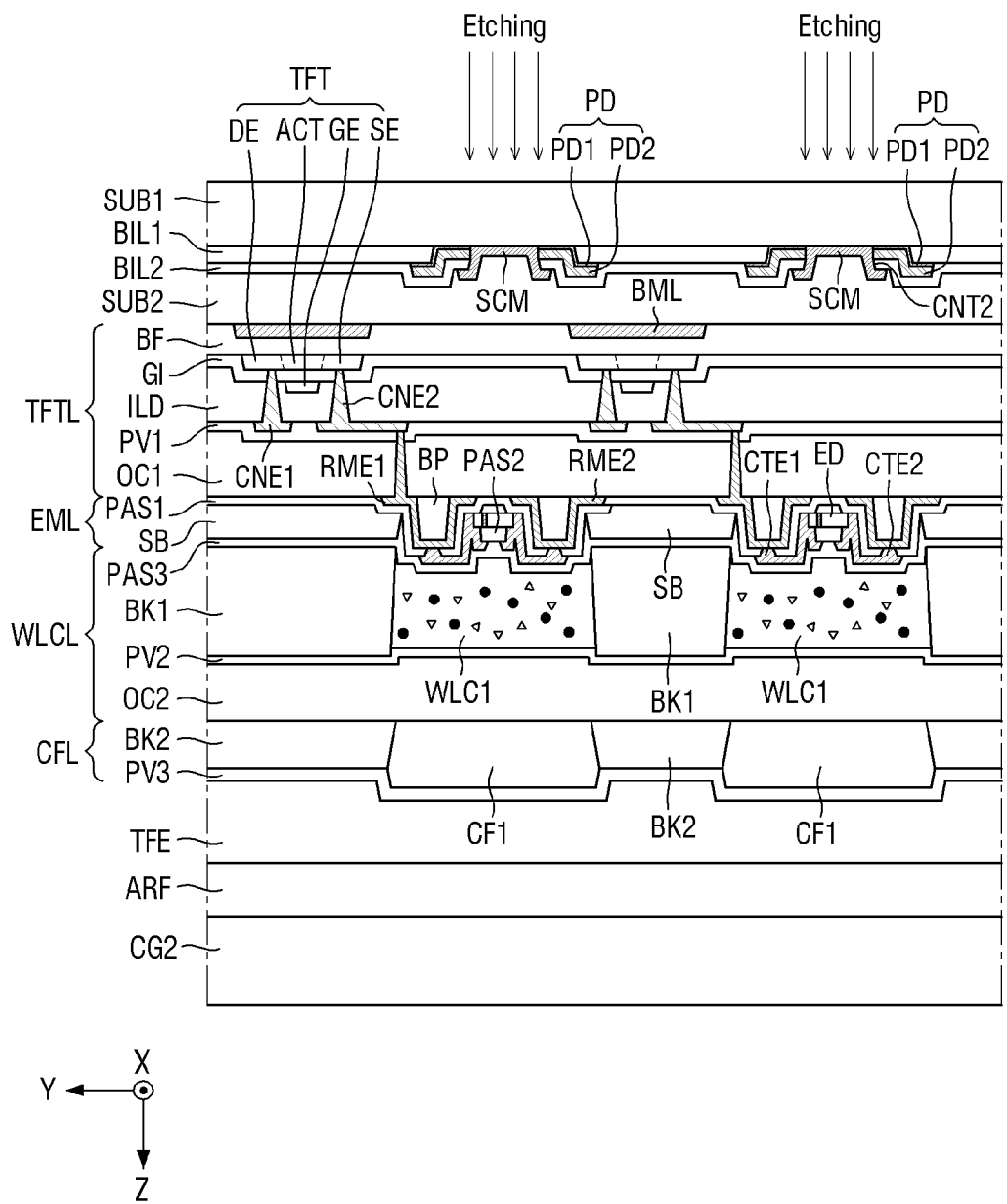

In FIG. 18, the display device 10 being manufactured may be turned upside down to form bump electrodes SDB and a flexible film FPCB. The first carrier substrate CG1 may be removed from the first substrate SUB1. In an embodiment, for example, the first carrier substrate CG1 may be removed from a lower surface of the first substrate SUB1 using a sacrificial layer (not illustrated) disposed between the first carrier substrate CG1 and the first substrate SUB1, but the present disclosure is not limited thereto.

A second carrier substrate CG2 may be disposed on a surface of the antireflection layer ARF. The second carrier substrate CG2 may support the display device 10 turned upside down. In an embodiment, for example, the second carrier substrate CG2 may be, but is not limited to, a carrier glass.

At least one of a dry etching process, a plasma etching process, and a laser etching process may be performed on a surface of the first substrate SUB1. In an embodiment, for example, the surface of the first substrate SUB1 may be patterned through a plasma etching process using atmospheric pressure plasma.

Figure 19:
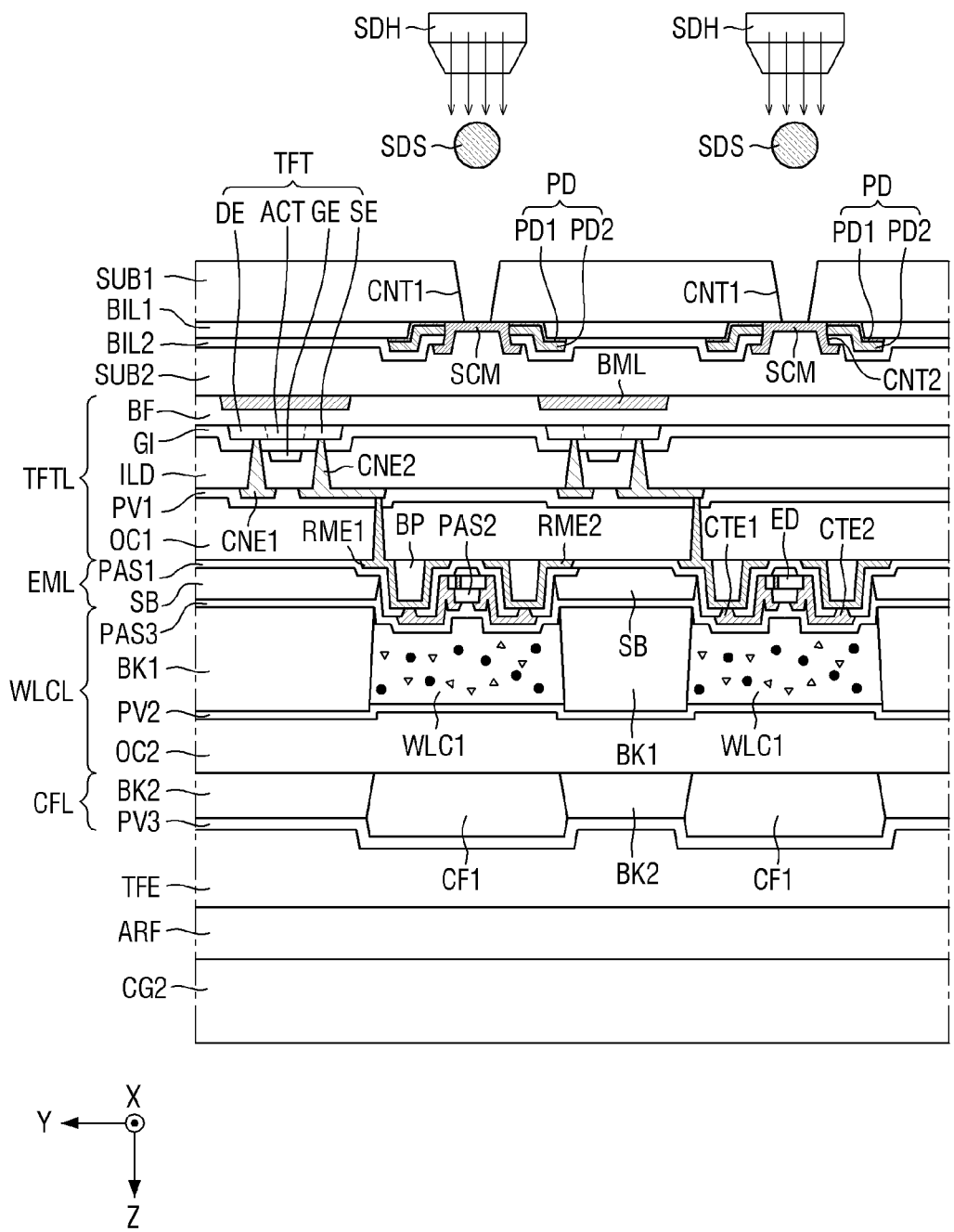

In FIG. 19, a plurality of first contact holes CNT1 may be provided in the first substrate SUB1 and may expose corresponding bump connection electrodes SCM, respectively.

The bump electrodes SDB may be solder balls. The bump electrodes SDB may be formed using a jet soldering process. A solder head SDH may inject a solder solution SDS toward the first contact holes CNT1. The solder solution SDS may include at least one of tin (Sn), silver (Ag), copper (Cu), gold (Au), and nickel (Ni). The solder solution SDS may be heated to have a liquid state and, in the liquid state, may fill the first contact holes CNT1.

Figure 20:
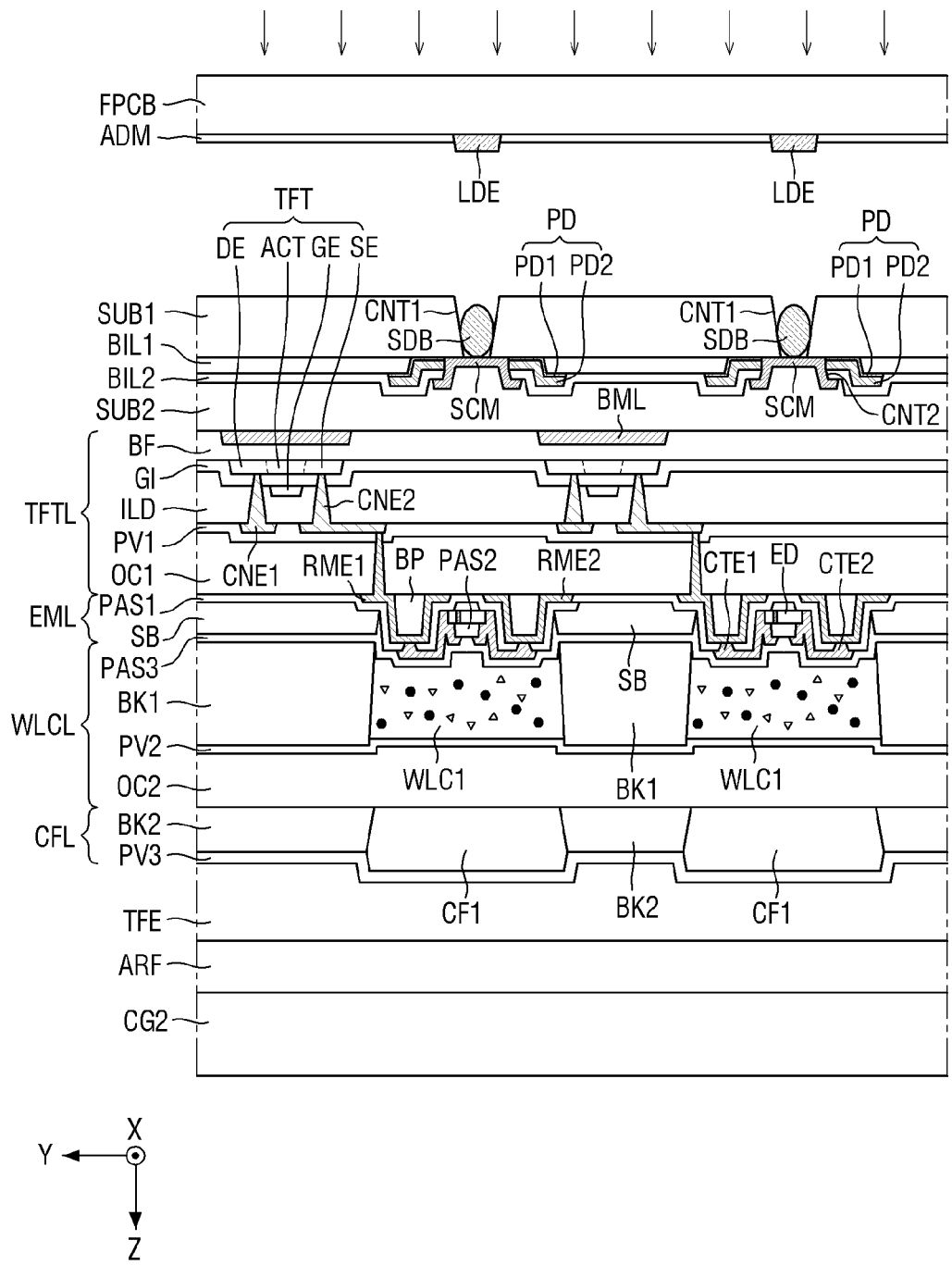
Figure 21:
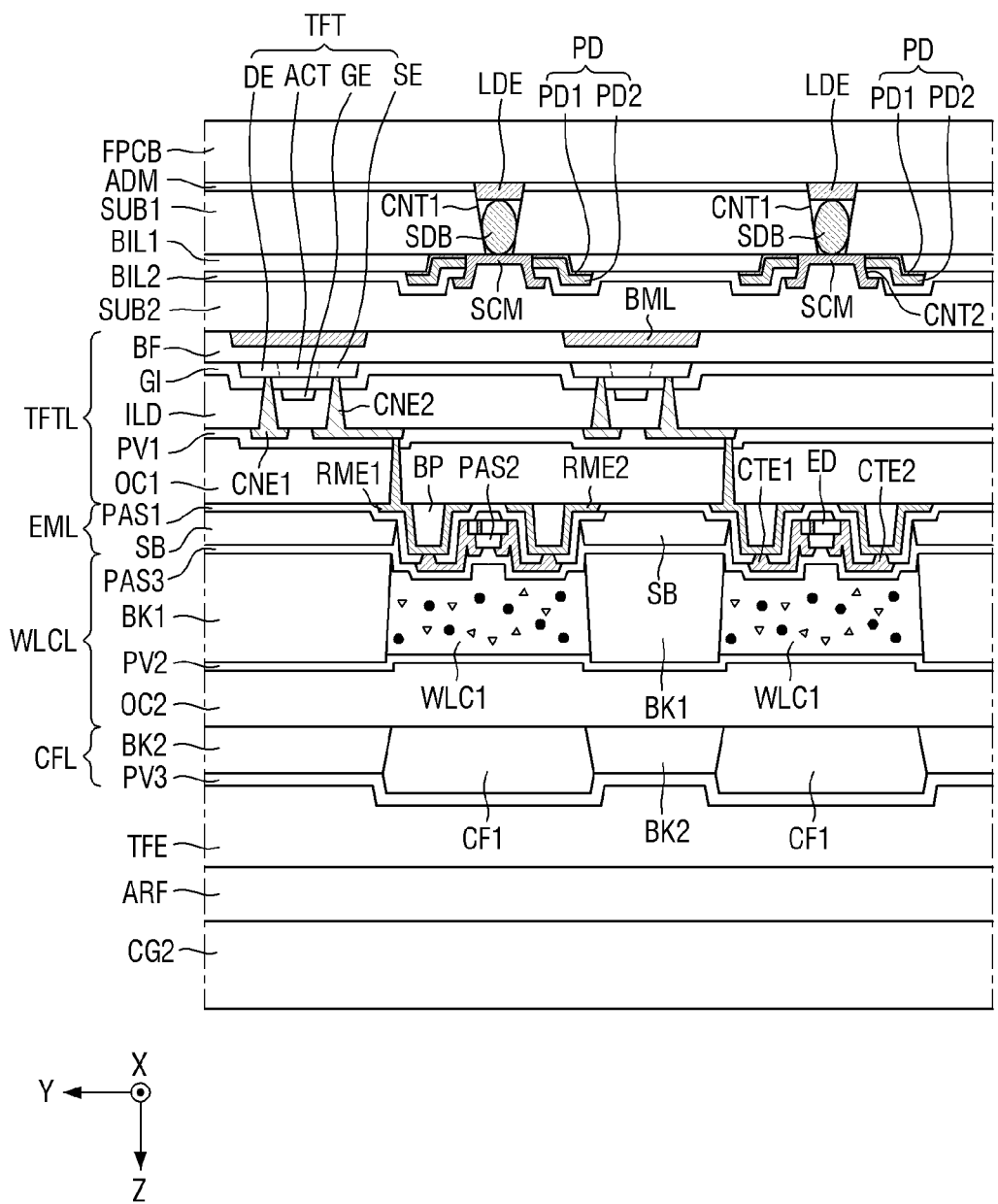

In FIGS. 20 and 21, the flexible film FPCB may include a plurality of lead electrodes LDE corresponding to the pad parts PD, respectively. The flexible film FPCB may be aligned such that the lead electrodes LDE are disposed corresponding to positions of the first contact holes CNT1, respectively. An adhesive member ADM may be disposed on a surface of the flexible film FPCB which faces the first substrate SUB1. Optionally, the adhesive member ADM may be omitted.

The bump electrodes SDB may be compressed using a relatively low pressure after being disposed between the lead electrodes LDE and the bump connection electrodes SCM. A compression force to the bump electrodes SDB may be applied by the lead electrodes LDE which protrude from the flexible film FPCB, in insertion of the lead electrodes LDE into the first contact holes CNT1 (refer to arrows in FIG. 20). At least a part of each of the lead electrodes LDE may be inserted into a first contact hole CNT1. The lead electrodes LDE may be self-aligned by insertion thereof into the first contact holes CNT1, and the first substrate SUB1 may serve as a dam that physically holds the lead electrodes LDE. The lead electrodes LDE, the bump electrodes SDB, and the bump connection electrodes SCM may overlap in the thickness direction (Z-axis direction). The lead electrodes LDE may be insulated by the first substrate SUB1. The bump electrodes SDB may be formed without using a high-pressure compression process used in a process of forming an anisotropic conductive film. Therefore, the display device 10 may electrically connect each of the lead electrodes LDE of the flexible film FPCB to a corresponding pad part PD without using an anisotropic conductive film.

Since the flexible film FPCB is overlapped by the display area DA in the thickness direction (Z-axis direction), if the flexible film FPCB is electrically connected to the pad parts PD using a conventional anisotropic conductive film formed by a high-pressure compression process, the display area DA may be damaged, thus deteriorating visibility. However, since one or more embodiment of the display device 10 electrically connects the flexible film FPCB and the pad parts PD using the bump electrodes SDB, damage to the display area DA can be reduced or effectively prevented, and visibility of the display device 10 can be improved.

The display device 10 may include or define the first contact holes CNT1 corresponding to the pad parts PD, respectively, each of the lead electrodes LDE may extend into a corresponding first contact hole CNT1, and one lead electrode LDE may be connected to one pad part PD through a bump electrode SDB. The pad parts PD or the lead electrodes LDE may be insulated by portions of the first substrate SUB1. Therefore, the display device 10 can reduce or effectively prevent a short circuit between the pad parts PD or the lead electrodes LDE.

In an embodiment, for another example, the bump electrodes SDB may be formed using a solder paste process or a solder film process. Therefore, the display device 10 may electrically connect the flexible film FPCB and the pad parts PD using the bump electrodes SDB without using an anisotropic conductive film formed through a conventional high-pressure compression process.

Figure 22:
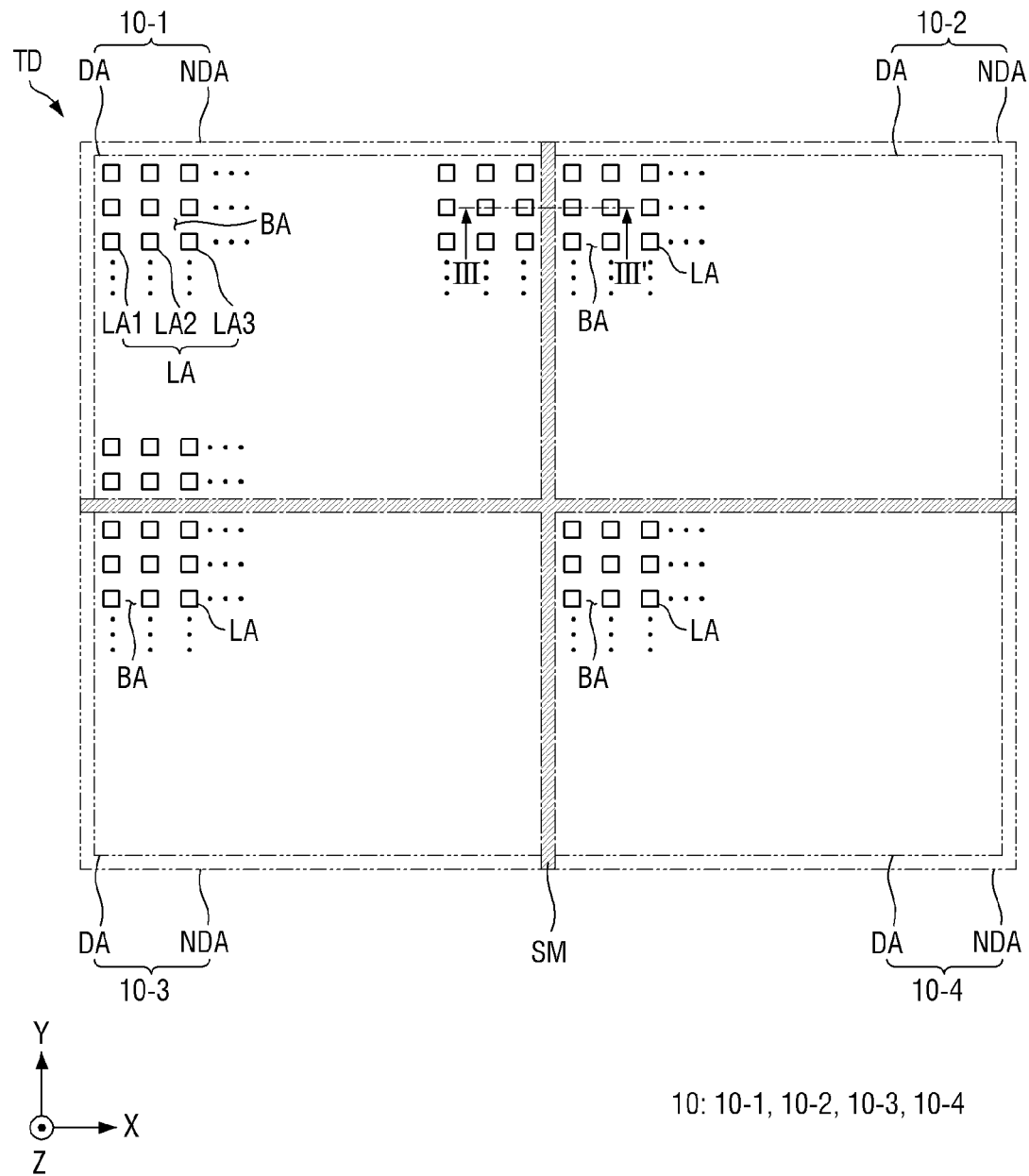
FIG. 22 is a plan view illustrating an embodiment of the coupling structure of a tiled display device.
Figure 23:
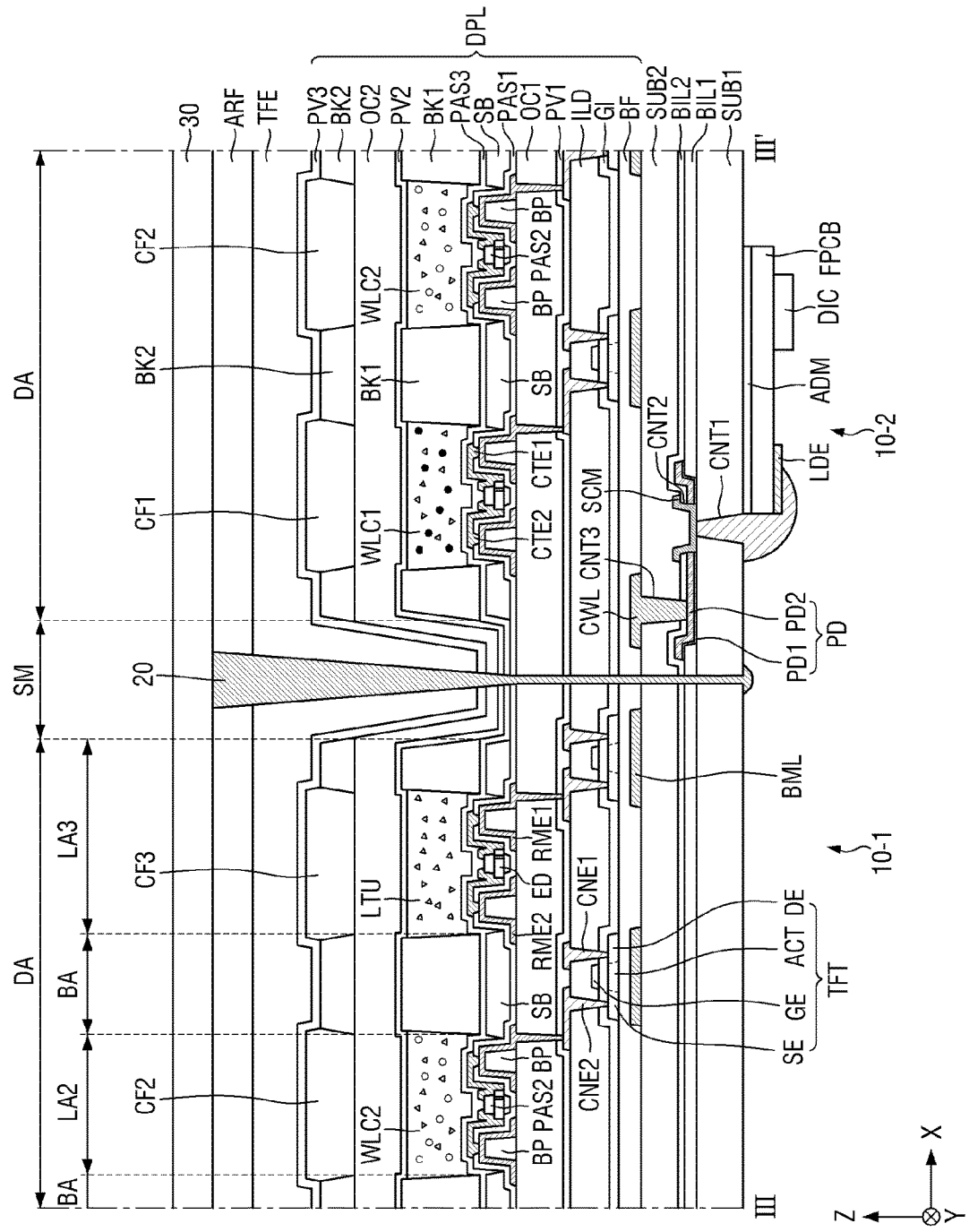
FIG. 23 is a cross-sectional view taken along line of FIG. 22.

FIG. 22 is a plan view illustrating an embodiment of a coupling structure of a tiled display device TD. FIG. 23 is a cross-sectional view taken along line III-III' of FIG. 22.

Referring to FIGS. 22 and 23, the tiled display device TD may include a plurality of display devices 10, a coupling member 20, and a cover member (not illustrated). The display devices 10 may be arranged in a lattice shape, but the present disclosure is not limited thereto. The display devices 10 may be connected to each other in the first direction (X-axis direction) or the second direction (Y-axis direction), and the tiled display device TD may have a shape. In an embodiment, for example, the display devices 10 may have the same size, but the present disclosure is not limited thereto. In an embodiment, for another example, the display devices 10 may have different sizes.

The tiled display device TD may include first through fourth display devices 10-1 through 10-4. The number and coupling relationship of the display devices 10 are not limited to the embodiment of FIG. 22. The number of display devices 10 may be determined by the size of each of the display devices 10 and the tiled display device TD. In an embodiment, for example, the tiled display device TD may include the display device 10 illustrated in FIG. 3. In an embodiment, for another example, the tiled display device TD may include the display device 10 illustrated in FIG. 14.

Each of the display devices 10 may include a display area DA and a non-display area NDA. The display area DA may include a plurality of pixels to display an image. The non-display area NDA may be adjacent to the display area DA, such as to surround the display area DA and may not display an image.

The tiled display device TD may include a coupling area SM disposed between a plurality of display areas DA. The tiled display device TD may be formed by connecting the respective non-display areas NDA of adjacent display devices 10. The display devices 10 may be connected to each other through the coupling member 20 or an adhesive member disposed in the coupling area SM. The coupling area SM of each of the display devices 10 may not include (e.g., may exclude a portion of) a pad part PD or a flexible film FPCB which is attached to the pad part PD. Therefore, a distance between the respective display areas DA of the display devices 10 may be small enough to make the coupling area SM between the display devices 10 unrecognizable from outside of the tiled display device TD. In addition, external light reflectance at the display area DA of each of the display devices 10 and external light reflectance at the coupling area SM between the display devices 10 may be substantially equal. Therefore, the tiled display device TD may eliminate a sense of separation between the display devices 10 and improve the degree of immersion in images by reducing or effectively preventing the coupling area SM between the display devices 10 from being recognized from outside of the tiled display device TD.

Each of the display devices 10 may include a plurality of pixels arranged along a plurality of rows and a plurality of columns in the display area DA. Each of the pixels may include a light emitting area LA defined by a pixel defining layer or a bank and may emit light having a peak wavelength through the light emitting area LA. In an embodiment, for example, the display area DA of each of the display devices 10 may include first through third light emitting areas LA1 through LA3. Each of the first through third light emitting areas LA1 through LA3 may be an area where light generated by a light emitting element ED of a display device 10 is emitted to the outside of the display device 10.

The first through third light emitting areas LA1 through LA3 may be sequentially and repeatedly arranged along the first direction (X-axis direction) of the display area DA. In an embodiment, for example, the area of the first light emitting area LA1 may be larger than the area of the second light emitting area LA2, and the area of the second light emitting area LA2 may be larger than the area of the third light emitting area LA3. In an embodiment, for another example, the area of the first light emitting area LA1, the area of the second light emitting area LA2, and the area of the third light emitting area LA3 may be substantially equal.

The display area DA of each display device 10 may include a light blocking area BA which is adjacent to, such as surrounding, the light emitting areas LA. The light blocking area BA may reduce or effectively prevent color mixing of light emitted from the first through third light emitting areas LA1 through LA3.

The tiled display device TD may be formed by coupling side surfaces (e.g., outer side surfaces) of adjacent display devices 10 to each other using the coupling member 20 disposed between the display devices 10. The outer side surfaces of adjacent display devices 10 face each other at the coupling area SM. The coupling member 20 may connect the respective facing side surfaces of the first through fourth display devices 10-1 through 10-4 arranged in a lattice shape, thereby realizing the tiled display device TD. Various components or layers of the display device 10 may define a side surface (e.g., outer side surface) of the display device 10. The coupling member 20 may couple facing side surfaces of first substrates SUB1, facing side surfaces of first and second barrier insulating layers BIL1 and BIL2, facing side surfaces of second substrates SUB2, facing side surfaces of display layers DPL, facing side surfaces of encapsulation layers TFE, and facing side surfaces of antireflection layers ARE of adjacent display devices 10.

In an embodiment, for example, the coupling member 20 may be made of an adhesive or double-sided tape having a relatively small thickness to minimize a distance between the display devices 10. in an embodiment, for another example, the coupling member 20 may be made of a coupling frame having a relatively small thickness to minimize the distance between the display devices 10. Therefore, the tiled display device TD may reduce or effectively prevent the coupling area SM between the display devices 10 from being recognized from outside the tiled display device TD.

The cover member may be disposed on upper surfaces of the display devices 10 and upper surfaces of the coupling member 20 to cover the display devices 10 and the coupling member 20. In an embodiment, for example, the cover member may be disposed on an upper surface of the anti-reflection layer ARF of each of the display devices 10. The cover member may protect an upper surface of the tiled display device TD.

In one or more embodiment of a display device 10, a method of providing the same, and a tiled display device TD including the display device 10, damage to a display area DA and improved visibility are provided by electrically connecting a flexible film FPCB disposed under a substrate and a pad part PD disposed above the substrate (e.g., on opposing sides of the substrate) by using a bump electrode SDB and by excluding a thermocompression process.

In one or more embodiment of a display device 10, a method of providing the same, and a tiled display device TD including the display device 10, the planar area of a non-display area NDA is reduced by electrically connecting a flexible film FPCB disposed under a substrate and a pad part PD disposed on the substrate. Therefore, the tiled display device TD can prevent recognition of the non-display area NDA or boundary part between a plurality of display devices 10 from being recognized from outside the tiled display device TD by minimizing a distance between the display devices 10.

However, the effects of the present disclosure are not restricted to the one set forth herein. The above and other effects of the present disclosure will become more apparent to one of daily skill in the art to which the present disclosure pertains by referencing the claims.

What is claimed is:

1. A display device comprising:
   a first substrate comprising a display area including an upper surface of the first substrate, a display layer and a transistor layer on the upper surface. and a lower surface of the first substrate which is opposite to the upper surface; and
   within the display area:
      a first contact hole which is defined extended through the first substrate;
      a flexible film on the lower surface of the first substrate, the flexible film comprising a lead electrode which is on the lower surface of the first substrate and adjacent to the first contact hole;
      a pad part which is on the upper surface of the first substrate and connects the transistor layer to the lead electrode of the flexible film, and a second contact hole which is defined extended through the pad part and overlaps the first contact hole;
      a bump connection electrode on the pad part and extended through the pad part at the second contact hole; and
      a bump electrode electrically connecting the lead electrode which is on the lower surface of the first substrate to the bump connection electrode which is on the upper surface of the first substrate.

2. The display device of claim 1, wherein
   the bump electrode is in the first contact hole and contacts the bump connection electrode at the upper surface of the first substrate, and
   the bump electrode which is in the first contact hole extends outside of the first contact hole to define a portion of the bump electrode which is outside of the first substrate and outside of the flexible film, the portion of the bump electrode covering a portion of the lead electrode and a portion of the lower surface of the first substrate.

3. The display device of claim 1, wherein
   the bump electrode is in the first contact hole, and
   in a direction from the first substrate to the flexible film:
      the lead electrode includes a lower surface which is furthest from the lower surface of the first substrate,
      the bump electrode which is in the first contact hole extends outside of the first contact hole to define a lower end of the bump electrode which is outside of the first substrate and furthest from the lower surface of the first substrate, and
      a distance between the lower end of the bump electrode and the lower surface of the first substrate is greater than a distance between the lower surface of the lead electrode and the lower surface of the first substrate.

4. The display device of claim 1, wherein the bump electrode is a solder ball comprising tin, silver, copper, gold, or nickel.

5. The display device of claim 1, wherein
   the pad part comprises a lower electrode and an upper electrode in order from the upper surface of the first substrate, and
   the bump connection electrode comprises an adhesion to the bump electrode which is stronger than an adhesion to the lower electrode of the pad part.

6. The display device of claim 5, wherein the lower electrode of the pad part comprises an adhesion to the first substrate which is stronger than an adhesion to the upper electrode of the pad part.

7. The display device of claim 1,
   wherein the display layer is on the pad part and the bump connection electrode and comprises:
      the transistor layer comprising a connection line and a thin-film transistor which is connected to the connection line;
      a light emitting element layer comprising a light emitting element which emits light; and
      a wavelength conversion layer which converts a wavelength of light emitted from the light emitting element.

8. The display device of claim 7, further comprising:
   a second substrate facing the first substrate with the pad part and the bump connection electrode therebetween,
   a third contact hole which is defined in the second substrate and exposes the pad part to outside the second substrate, and
   the second substrate and the transistor layer in order from the first substrate,
   wherein the connection line of the transistor layer extends into the third contact hole defined in the second substrate to contact the pad part.

9. The display device of claim 8, wherein the connection line of the transistor layer supplies an electric signal from the pad part to the thin-film transistor of the transistor layer.

10. The display device of claim 7, wherein in a direction from the first substrate to the display layer, the bump electrode and the flexible film overlap the light emitting element.

11. A method of providing a display device, the method comprising:
    providing a first substrate comprising a display area including an upper surface of the first substrate. a display layer and a transistor layer on the upper surface. and a lower surface of the first substrate which is opposite to the upper surface; and
    within the display area:
       providing a first contact hole which is extended through the first substrate;
       providing a flexible film which is on the lower surface of the first substrate and provides an electrical signal to the transistor layer, the flexible film comprising a lead electrode adjacent to the first contact hole;
       providing a pad part through which the electric signal transmits from the flexible film, the pad part being on the upper surface of the first substrate which is opposite to the lower surface and connects the transistor layer to the lead electrode of the flexible film;
       providing a second contact hole which is extended through the pad part and overlaps the first contact hole;
       providing a bump connection electrode on the upper surface of the first substrate, the bump connection electrode extended into the second contact hole to be surrounded by portions of the pad part; and providing a bump electrode electrically connecting the lead electrode of the flexible film and the bump connection electrode to each other.

12. The method of claim 11, wherein the providing of the bump electrode comprises a jet soldering process, a solder paste process, or a solder film process.

13. The method of claim 12, wherein the jet soldering process comprises:
covering the lead electrode of the flexible film and the first contact hole in the first substrate by injection of a solder solution heated to a liquid state, to the lead electrode and the first contact hole, and
providing a solder ball by cooling and solidifying the solder solution, to provide the bump electrode.

14. The method of claim 11, wherein the bump electrode comprises a solder ball comprising tin, silver, copper, gold, or nickel.

15. The method of claim 11, wherein the providing of the bump electrode comprises extending the bump electrode outside of the first contact hole to define a portion of the bump electrode which is outside of the first substrate and outside of the flexible film, the portion of the bump electrode covering a portion of the lead electrode and a portion of the lower surface of the first substrate.

16. The method of claim 11, wherein the providing of the pad part comprises providing a lower electrode and an upper electrode in order from the upper surface of the first substrate.

17. The method of claim 16, wherein the providing of the bump connection electrode comprises providing the bump connection electrode having a stronger adhesion to the bump electrode than to the lower electrode of the pad part.

18. The method of claim 16, further comprising:
providing a second substrate which faces the first substrate with the bump connection electrode therebetween,
providing a third contact hole in the second substrate which exposes the pad part to outside the second substrate; and
providing a connection line of the transistor layer which is further from the first substrate than the second substrate and extended into the third contact hole to contact the pad part.

19. A display device comprising:
a first substrate comprising a display area including an upper surface of the first substrate. a display layer and a transistor layer on the upper surface. and a lower surface of the first substrate which is opposite to the upper surface; and
within the display area:
a plurality of first contact holes which are defined extended through the first substrate;
a flexible film on the lower surface of the first substrate, the flexible film comprising a plurality of lead electrodes adjacent to the plurality of first contact holes, respectively;
a plurality of pad parts through which electric signals transmit from the flexible film, the plurality of pad parts being on the upper surface of the first substrate and connecting the transistor layer to the plurality of lead electrodes, respectively, and a plurality of second contact holes which are defined extended through the plurality of pad parts and overlap to the plurality of first contact holes, respectively;
a plurality of bump connection electrodes on the plurality of pad parts and extended through the plurality of pad parts at the plurality of second contact holes, respectively;
a plurality of bump electrodes in the plurality of first contact holes, respectively; and
a corresponding bump electrode among the plurality of bump electrodes which electrically connects a corresponding lead electrode among the plurality of lead electrodes to a corresponding bump connection electrode among the plurality of bump connection electrodes.

20. The display device of claim 19, wherein the plurality of lead electrodes extend from outside the first substrate and into a corresponding first contact hole among the plurality of first contact holes, respectively.

21. The display device of claim 19, wherein in a direction from the first substrate to the flexible film, the corresponding lead electrode, the corresponding bump electrode connected and the corresponding bump connection electrode are aligned with each other.

22. The display device of claim 19, wherein the plurality of pad parts or the plurality of lead electrodes are insulated from each other by the first substrate.

23. The display device of claim 19, wherein the plurality of bump electrodes includes a solder ball comprising tin, silver, copper, gold, or nickel.

24. A tiled display device comprising:
a plurality of display devices; and
a coupling area which is between adjacent display devices among the plurality of display devices and at which the adjacent display devices are coupled to each other,
wherein each of the display devices comprises:
a display area including a plurality of pixels and a transistor layer;
a non-display area adjacent to the display area; and
within the display area:
a first substrate, and a first contact hole which is extended through the first substrate;
a flexible film on a lower surface of the first substrate, the flexible film comprising a lead electrode which is on the lower surface of the first substrate and adjacent to the first contact hole;
a pad part on an upper surface of the first substrate which is opposite to the lower surface, the pad part connecting the transistor layer to the lead electrode of the flexible film, and a second contact hole which is defined extended through the pad part and overlaps to the first contact hole;
a bump connection electrode on the pad part and extended through the pad part at the second contact hole;
a bump electrode electrically connecting the lead electrode which is on the lower surface of the first substrate to the bump connection electrode which is on the upper surface of the first substrate, the bump electrode excluded from the coupling area.

25. The tiled display device of claim 24, wherein the bump electrode is in the first contact hole, contacts the bump connection electrode at the upper surface of the first substrate, and extends from the first contact hole to outside the first substrate to cover a portion of the lead electrode and a portion of the lower surface of the first substrate.

* * * * *